United States Patent
Takeshima

(10) Patent No.: US 10,274,567 B2
(45) Date of Patent: Apr. 30, 2019

(54) MAGNETIC RESONANCE IMAGING APPARATUS AND IMAGE PROCESSING APPARATUS

(71) Applicant: TOSHIBA MEDICAL SYSTEMS CORPORATION, Otawara-shi, Tochigi (JP)

(72) Inventor: Hidenori Takeshima, Ebina Kanagawa (JP)

(73) Assignee: TOSHIBA MEDICAL SYSTEMS CORPORATION, Otawara-Shi, Tochigi-Ken (JP)

( * ) Notice: Subject to any disclaimer, the term of this patent is extended or adjusted under 35 U.S.C. 154(b) by 1173 days.

(21) Appl. No.: 14/513,736

(22) Filed: Oct. 14, 2014

(65) Prior Publication Data

US 2015/0028872 A1    Jan. 29, 2015

Related U.S. Application Data

(63) Continuation of application No. PCT/JP2013/076346, filed on Sep. 27, 2013.

(30) Foreign Application Priority Data

Oct. 1, 2012    (JP) ................. 2012-219879

(51) Int. Cl.
*G01V 3/00*        (2006.01)
*G01R 33/385*    (2006.01)
(Continued)

(52) U.S. Cl.
CPC ........ *G01R 33/5611* (2013.01); *G01R 33/385* (2013.01); *G01R 33/4818* (2013.01); *G01R 33/56509* (2013.01)

(58) Field of Classification Search
CPC .................................................. G01R 33/5611
(Continued)

(56) References Cited

U.S. PATENT DOCUMENTS

| 7,319,324 B2 | 1/2008 | Kannengießer et al. |
| 9,279,873 B2 * | 3/2016 | Xue ................... G01R 33/5611 |

(Continued)

FOREIGN PATENT DOCUMENTS

| JP | 2003-325473 | 11/2003 |
| JP | 2005-525184 | 8/2005 |
| JP | 2005-525186 | 8/2005 |

OTHER PUBLICATIONS

International Search Report for PCT/JP2013/076346 dated Dec. 17, 2013.

(Continued)

*Primary Examiner* — Louis M Arana
(74) *Attorney, Agent, or Firm* — Nixon & Vanderhye P.C.

(57) ABSTRACT

A magnetic resonance imaging apparatus according to one embodiment includes an arranger, a sensitivity deriver, and an image generator. The arranger arranges time-series data at a part of sampling points out of sampling points of a k-space determined based on an imaging parameter. The sensitivity deriver derives a sensitivity distribution in a time-space, in which the time-series data transformed in a time direction is expressed with a coefficient value, based on the time-series data. The image generator generates an image of the time-series data using the time-series data and the sensitivity distribution.

12 Claims, 15 Drawing Sheets

(51) Int. Cl.
  *G01R 33/561* (2006.01)
  *G01R 33/48* (2006.01)
  *G01R 33/565* (2006.01)

(58) Field of Classification Search
  USPC ........................................ 324/309, 307, 306
  See application file for complete search history.

(56) References Cited

U.S. PATENT DOCUMENTS

| | | | |
|---|---|---|---|
| 2005/0174113 A1 | 8/2005 | Tsao et al. | |
| 2005/0189942 A1 | 9/2005 | Tsao et al. | |
| 2013/0285655 A1 | 10/2013 | Miyazaki et al. | |
| 2013/0285662 A1 | 10/2013 | Takeshima | |
| 2015/0276908 A1* | 10/2015 | Takeshima | G01R 33/5611 324/322 |
| 2015/0369893 A1* | 12/2015 | Takeshima | G01R 33/4818 324/309 |
| 2017/0045598 A1* | 2/2017 | Takeshima | G01R 33/4818 |
| 2017/0069115 A1* | 3/2017 | Saito | G06T 11/005 |

OTHER PUBLICATIONS

J. Tsao, et el., "k-t BLAST and k-t SENSE: Dynamic MRI with High Frame Rate Exploiting Spatiotemporal Correlations," *Magnetic Resonance in Medicine*, 50, 2003, pp. 1031-1042.

D. Xu, et al., "Improving k-t SENSE by Adaptive Regularization," *Magnetic Resonance in Medicine*, 57, 2007, pp. 918-930.

Extended European Search Report dated Jun. 16, 2016 in EP 1384462.5.

Malik, Shaihan J. et al., "x-f Choice: Reconstruction of Undersampled Dynamic MRI by Data-Driven Alias Rejection Applied to Contrast-Enhanced Angiography," Magnetic Resonance in Medicine, vol. 56, No. 4, Jan. 1, 2006, pp. 811-823, XP055277530.

Blaimer, Martin., et al., "Temporal Filtering Effects in Dynamic Parallel MRI," Magnetic Resonance in Medicine, vol. 66, No. 1, Jul. 1, 2011, pp. 192-198, XP055277533.

J. Tsao et al. "k-t BLAST and k-t SENSE: Dynamic MRI with High Frame Rate Exploiting Spatiotemporal Correlations", Magnetic Resonance in Medicine 50, 2003, pp. 1031-1042.

D. Xu et al., "Improving k-t SNESE by Adaptive Regularization", Magnetic Resonance in Medicine, 57, 2007, pp. 918-930.

* cited by examiner (A) TIME-SERIES DATA ARRANGED IN k-t SPACE (B) RECONSTRUCTION FRAME (C) SPECTRUM DATA OF x-f SPACE (A) TIME-SERIES DATA ARRANGED IN k-t SPACE (1/4 SAMPLING)

(B) RECONSTRUCTION FRAME (C) SPECTRUM DATA OF x-f SPACE

SENSITIVITY OF CENTRAL PORTION

MISSING SENSITIVITY

MISSING SENSITIVITY ations. Although a case of multiple coils is mainly explained hereafter, a case of a single coil is also acceptable as a special case of k-t BLAST. Note that a case of a single coil is also called k-t SENSE for convenience sake.

MAGNETIC RESONANCE IMAGING APPARATUS AND IMAGE PROCESSING APPARATUS

CROSS-REFERENCE TO RELATED APPLICATIONS

This application is a continuation of International Application No. PCT/JP2013/076346, filed on Sep. 27, 2013 which claims the benefit of priority of the prior Japanese Patent Application No. 2012-219879, filed on Oct. 1, 2012, the entire contents of which are incorporated herein by reference.

FIELD

Embodiments relate to a magnetic resonance imaging apparatus and an image processing apparatus.

BACKGROUND

A magnetic resonance imaging apparatus (hereinafter, MRI apparatus) is an apparatus that nondestructively visualizes an atom distribution inside a subject body, using a property of atoms such as hydrogen positioned in a magnetic field of selectively absorbing and radiating only electromagnetic waves of a frequency that is dependent on a type of an atom and a magnetic field among electromagnetic waves of various frequencies. A signal acquired by measuring electromagnetic waves that are radiated from the subject body by coils to be digitalized is called k-space data.

The k-space data is two-dimensional or three-dimensional data that can be acquired, for example, by repeating one-dimensional imaging. An atom distribution image inside a subject body can be acquired by performing the Fourier transform (hereinafter, the Fourier transform includes the inverse Fourier transform) on the k-space data. The acquired atom distribution image is called an MR (magnetic resonance) image, and the process of calculating the MR image from the k-space data is called reconstruction, image reconstruction, image generation, or the like. The central portion of the k-space data corresponds to low frequency components at the time of performing the Fourier transform on the MR image, and the peripheral portion of the k-space data corresponds to high frequency components at the time of performing the Fourier transform on the MR image.

In an MRI apparatus, k-space data that is required for reconstruction is acquired by repeatedly performing one-dimensional imaging, and it is known that this imaging generally requires time. Moreover, it is known that if a state of a subject body changes with time, the quality of a reconstructed MR image deteriorates. Therefore, for imaging time-series data having large data amount when a state of a subject body changes, for example, imaging of a heart beating, there is a strong demand for shortening time required therefor. To perform higher-speed imaging, for example, a technique of parallel imaging has been studied and developed that k-space data is acquired by down-sampling imaging with multiple coils at the same time using sensitivity that varies depending on arrangement of coils, and an MR image is reconstructed from the multiple pieces of acquired k-space data while suppressing artifacts.

As a technique of parallel imaging for time-series k-space data, a technique called k-t BLAST (k-space time broad-use linear acquisition speed-up technique) or k-t SENSE (sensitivity encoding) has been known. It is called k-t BLAST when the number of coils is few with respect to a rate of down-sampling samples, and k-t SENSE when it is not; however, in the explanation below, it is called k-t SENSE including k-t BLAST unless otherwise explicitly distinguished. Although a case of multiple coils is mainly explained hereafter, a case of a single coil is also acceptable as a special case of k-t BLAST. Note that a case of a single coil is also called k-t SENSE for convenience sake.

DETAILED DESCRIPTION

A magnetic resonance imaging apparatus according to one embodiment includes an arranger, a sensitivity deriver, and an image generator. The arranger arranges time-series data at a part of sampling points out of sampling points of a k-space determined based on an imaging parameter. The sensitivity deriver derives a sensitivity distribution in a time-space, in which the time-series data transformed in a time-direction is expressed with a coefficient value, based on the time-series data. The image generator generates an image of the time-series data using the time-series data and the sensitivity distribution.

A magnetic resonance imaging apparatus and an image processing apparatus according to an embodiment are explained in detail below.

(First Embodiment)

Figure 1:
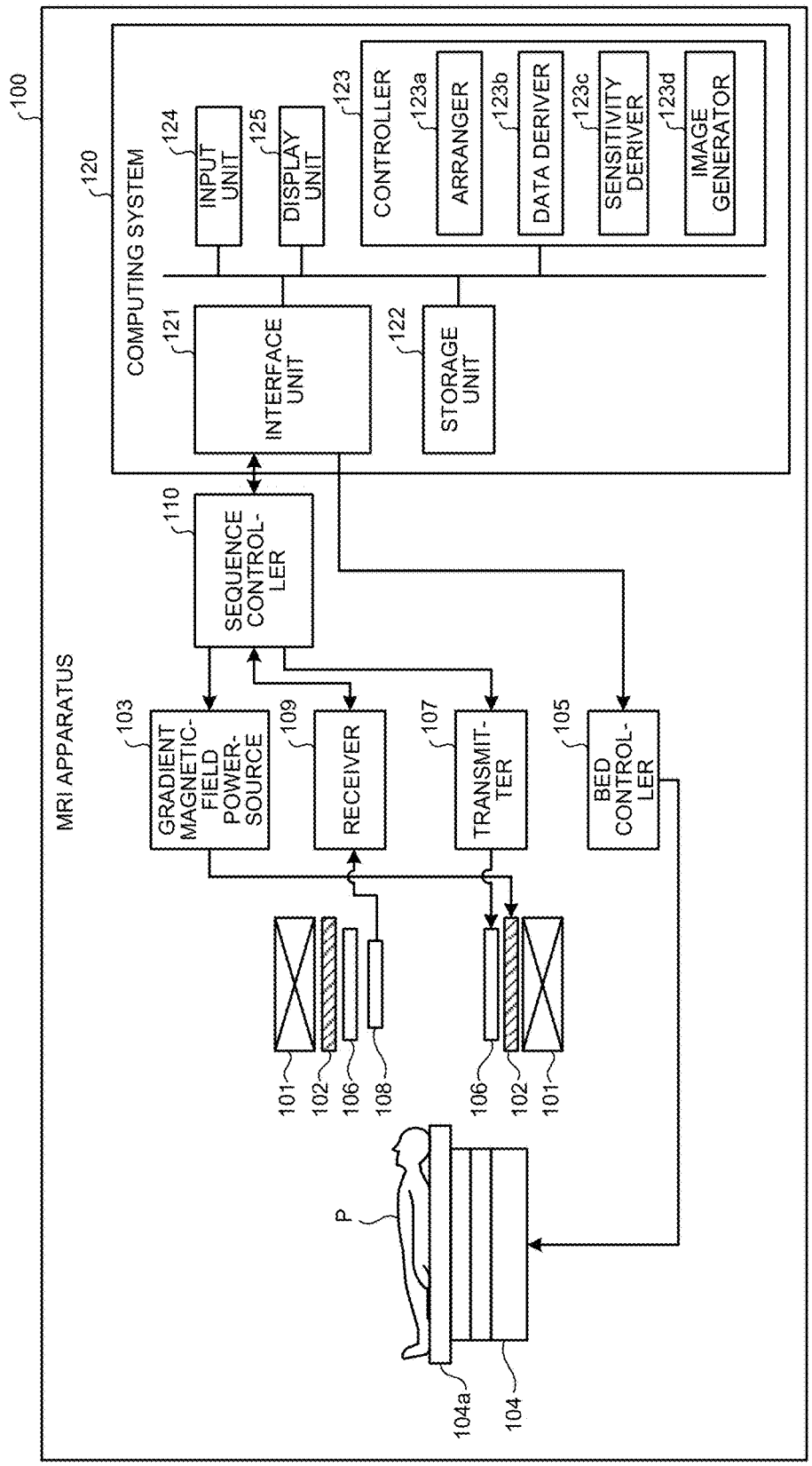
FIG. 1 is a block diagram of an MRI apparatus according to a first embodiment.

FIG. 1 is a block diagram of an MRI apparatus 100 according to a first embodiment. As shown in FIG. 1, the MRI apparatus 100 includes a static magnetic-field magnet 101, a gradient magnetic-field coil 102, a gradient magnetic-field power-source 103, a bed 104, a bed controller 105, a transmission coil 106, a transmitter 107, a reception coil array 108, a receiver 109, a sequence controller 110, and a computing system 120 (also called "image processing device"). A subject P (for example, human body) is not included in the MRI apparatus 100.

The static magnetic-field magnet 101 is a magnet that is formed in a cylindrical shape with a hollow, and generates a uniform static magnetic field in a space inside. The static magnetic-field magnet 101 is, for example, a permanent magnet, a super conducting magnet, or the like. The gradient magnetic-field coil 102 is a coil that is formed in a cylindrical shape with hollow, and is arranged inside the static magnetic-field magnet 101. The gradient magnetic-field coil 102 is formed with a combination of three coils corresponding to respective axes of X, Y, and Z that intersect at right angles with each other. These three coils receive an electric current individually from the gradient magnetic-field power-source 103 to generate a gradient magnetic field the magnetic field intensity of which varies along respective axes of X, Y, and Z. The direction of the X axis is identical to a static magnetic field.

The gradient magnetic-field power-source 103 supplies an electric current to the gradient magnetic-field coil 102. The static magnetic fields of respective axes of X, Y, and Z that are generated by the gradient magnetic-field coil 102 correspond, for example, to a slice-selecting gradient magnetic field Gs, a phase-encoding gradient magnetic field Ge, and a read-out gradient magnetic field Gr, respectively. The slice-selecting gradient magnetic field Gs is used to arbitrarily determine an imaging section. The phase-encoding gradient magnetic field Ge is used to vary a phase of an NMR signal according to a spatial position. The read-out gradient magnetic field Gr is used to vary the frequency of the NMR signal according to a spatial position.

The bed 104 includes a top panel 104a on which the subject P is mounted, and inserts the top panel 104a in a state that the subject P is mounted thereon into the hollow (imaging opening) of the gradient magnetic-field coil 102 under control by the bed controller 105. Usually, the bed 104 is arranged such that the longitudinal direction thereof is in parallel with the central axis of the static magnetic-field magnet 101. The bed controller 105 drives the bed 104 under control by the computing system 120 to move the top panel 104a in the longitudinal direction and the vertical direction.

The transmission coil 106 is arranged inside the gradient magnetic-field coil 102, and receives an RF pulse from the transmitter 107 to generate a high-frequency magnetic field. The transmitter 107 supplies the RF pulse corresponding to a Larmor frequency that is determined based on a type of a subject atom and the intensity of a magnetic field, to the transmission coil 106.

The reception coil array 108 is arranged inside the gradient magnetic-field coil 102, and receives the NMR signal that is emitted from the subject P by the influence of the high-frequency magnetic field. Upon receiving the NMR signal, the reception coil array 108 outputs the received NMR signal to the receiver 109. In the first embodiment, the reception coil array 108 is a coil array that has one or more, typically more than one, reception coil.

The receiver 109 generates NMR data based on the NMR signal output from the reception coil array 108. Specifically, the receiver 109 generates the NMR data by performing digital transformation on the NMR signal that is output from the reception coil array 108. Furthermore, the receiver 109 transmits the generated NMR data to the sequence controller 110. The receiver 109 can be equipped on a stand unit side having the static magnetic-field magnet 101, the gradient magnetic-field coil 102, and the like. In the first embodiment, the NMR signals output from respective coil elements (respective reception coils) of the reception coil array 108 are distributed and combined as necessary, to be output to the receiver 109 in a unit called channel or the like. Accordingly, the NMR data is handled in channel in the process in a stage subsequent to the receiver 109. As for the relation between the total number of the coil elements and the total number of the channels, it can be identical, or the total number of the channels can be fewer than the total number of the coil elements, or oppositely, the total number of the channels can be more than the total number of the coil elements. Hereafter, when it is described as "in each channel", the process can be performed in each coil element, or can be performed in each channel in which coil elements are distributed and combined. The timing for distribution and combination is not limited to the timing described above. The NMR signal or the NMR data can be distributed and combined into a channel unit any time prior to the process by a controller 123 to be described later.

The sequence controller 110 performs imaging of the subject P by driving the gradient magnetic-field power-source 103, the transmitter 107, and the receiver 109 based on sequence information transmitted from the computing system 120. The sequence information defines a procedure for performing imaging. In the sequence information, the strength of power to be supplied to the gradient magnetic-field coil 102 by the gradient magnetic-field power-source 103 and timing for supplying power source, the intensity of the RF pulse that is transmitted to the transmission coil 106 by the transmitter 107 and timing for applying the RF pulse, timing for detecting the NMR signal by the receiver 109, and the like are defined.

Upon receiving the NMR data (in the present embodiment, time-series data that is collected in chronological order along the time axis) from the receiver 109 as a result of imaging the subject P by driving the gradient magnetic-field power-source 103, the transmitter 107, and the receiver 109, the sequence controller 110 transfers the received NMR data to the computing system 120.

The computing system 120 performs overall control of the MRI apparatus 100, data collection, image reconstruction, and the like, and includes an interface unit 121, a storage unit 122, the controller 123, an input unit 124, and a display unit 125.

The interface unit 121 transmits the sequence information to the sequence controller 110, and receives the NMR data from the sequence controller 110. Moreover, the interface unit 121 stores the received NMR data in the storage unit 122 when the NMR data is received. The NMR data stored in the storage unit 122 is arranged in the k-space by an arranger 123a to be described later. As a result, the storage unit 122 stores k-space data of multiple channels.

The storage unit 122 stores the NMR data that is received by the interface unit 121, the time-series data that is arranged in the k-space by the arranger 123a, image data that is generated by an image generator 123d to be described later, and the like. For example, the storage unit 122 is an RAM (random access memory), a semiconductor memory device such as a flash memory, a hard disk, an optical disc, or the like. The input unit 124 receives various kinds of instructions or information input by an operator. The input unit 124 is, for example, a pointing device such as a mouse and a trackball, a selecting device such as a mode switching switch, or an input device such as a keyboard. The display unit 125 displays various kinds of information such as spectrum data and image data under control by the controller 123. The display unit 125 is, for example, a display device such as a liquid crystal display.

The controller 123 performs overall control of the MRI apparatus 100. Specifically, the controller 123 generates the sequence information based on an imaging condition input by an operator through the input unit 124, and transmits the generated sequence information to the sequence controller 110, to control imaging. Furthermore, the controller 123 controls image generation based on the NMR data that is transmitted from the sequence controller 110 as a result of imaging, or controls display by the display unit 125. For example, the controller 123 is an integrated circuit such as ASIC (application specific integrated circuit) and FPGA (field programmable gate array), or an electronic circuit such as CPU (central processing unit) and MPU (micro processing unit).

As explained below, in the present embodiment, a sensitivity distribution (hereinafter, sensitivity map) is derived on a time-space. The "time-space" herein is a space in which, by performing transformation in the time direction, time-series data is expressed in a coefficient value after transformation. The transformation performed herein is invertible, or can be any transformation that can be considered as approximately invertible transformation, and the transformation can be linear transform or nonlinear transform. For example, when the Fourier transform is used as the transformation, the time-space is to be an x-f space, which is a space where unfolding processing is performed in the k-t SENSE. The transformation is not limited to the Fourier transform, and can be, for example, the wavelet transform. Moreover, hereafter, a "space sensitivity value" in an image space, which is a real space, and a "time-space sensitivity value" in the time-space are distinguished as necessary for convenience of explanation. The "space sensitivity value" is a real sensitivity value that is acquired for each channel. On the other hand, the "time-space sensitivity value" is a virtual sensitivity value on a time-space. Furthermore, hereafter, "time-space sensitivity map" on the image space and "time-space sensitivity map" on the time-space are distinguished as necessary for convenience of explanation. The "space sensitivity map" is collection of real sensitivity values (space sensitivity values) of respective pixels for one channel. On the other hand, the "time-space sensitivity map" is collection of virtual sensitivity values (time-space sensitivity values) of respective pixels in the time-space for one channel. Furthermore, hereafter, a point in the image space is called "space pixel", and a point in the time-space is called "time-space pixel" as necessary for convenience of explanation.

When an unknown sensitivity map is to be derived, if a pixel that has no signal can be specified in advance, the sensitivity value of the specified pixel can be set to "zero", and accordingly, the performance of unfolding can be improved. In this point, the time-space sensitivity map in the time-space reflects motion of a subject in the time direction. Therefore, in the present embodiment, a pixel in which no motion is found is specified in advance using the nature that presence or absence of motion of a subject can be distinguished, and the sensitivity value of the specified pixel is set to "zero". For example, in the x-f space, when the motion of a subject is fast, signals thereof are distributed in a peripheral portion, and when the motion is slow, signals thereof are distributed in a central portion, and therefore, presence or absence of motion, that is, presence or absence of sensitivity can be distinguished from the signal values.

The controller 123 according to the present embodiment includes the arranger 123*a*, a data deriving unit 123*b*, a sensitivity deriver 123*c*, and the image generator 123*d* as shown in FIG. 1. Details of processing by each unit are described later.

Figure 2:
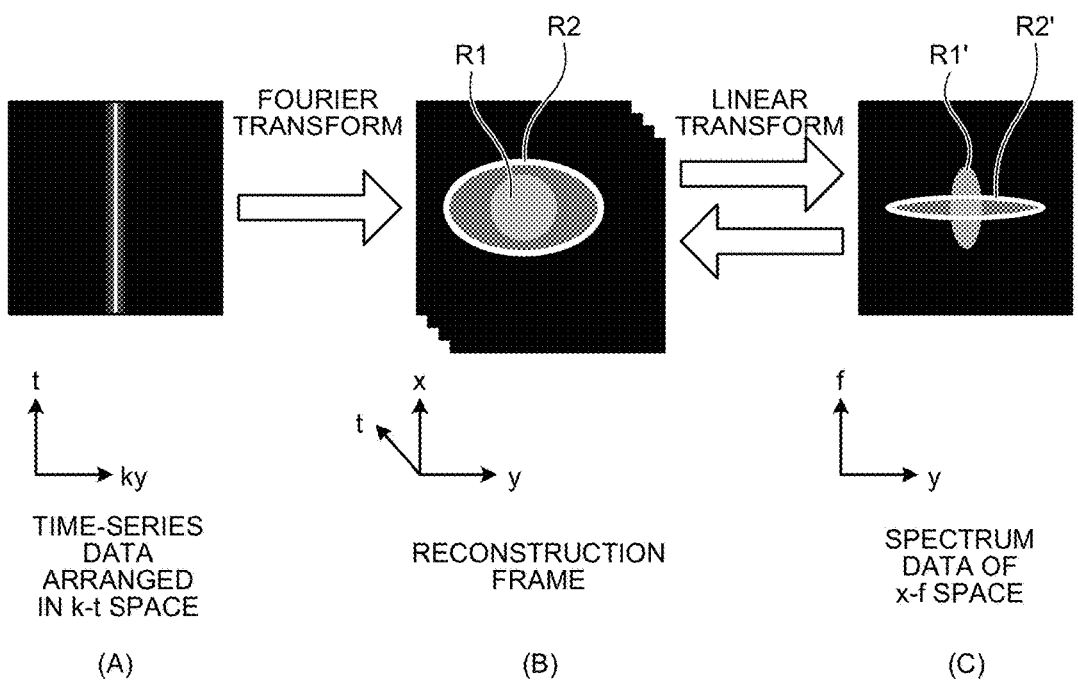
FIG. 2 is a diagram for explaining a k-t space and an x-f space in the present embodiment.

FIG. 2 is a diagram for explaining the k-t space and the x-f space in the present embodiment. In the present embodiment, time-series data is arranged only at some of sampling points out of full sampling points in the k-space as described later; however, the k-t space and the x-f space are explained herein assuming full sampling first.

FIG. 2(A) shows time-series data arranged in the k-t space. A kx axis is omitted in (A). FIG. 2(B) shows a reconstruction frame that is acquired by reconstructing the time-series data arranged in the k-t space by performing the Fourier transform for each frame. FIG. 2(C) shows spectrum data of the x-f space that is acquired by performing linear transform on the time-series reconstruction frames considering the time direction as one of the axes.

In the x-f space, the time direction is transformed into a time frequency. In the case that the time frequency of a pixel of fast motion is high, signals are distributed in the peripheral portion in the x-f space. In the case that the time frequency of a pixel of slow motion is low, signals are distributed in the central portion in the x-f space. In (B) and (C), a heart R1 (heart R1') and a heart wall R2 (heart wall R2') are schematically shown. For example, (C) shows that signals are distributed in the peripheral portion of the x-f space for the heart R1' with motion, and on the other hand, signals are distributed only in the central portion of the x-f space for the heart wall R2' without motion. In the present embodiment, the x-f space is explained as an example of a "time space in which time-series data is expressed in a coefficient value after transformation by performing transformation in the time direction"; however, the embodiment is not limited thereto. The transformation from reconstruction frames is not limited to the Fourier transform.

Figure 3:
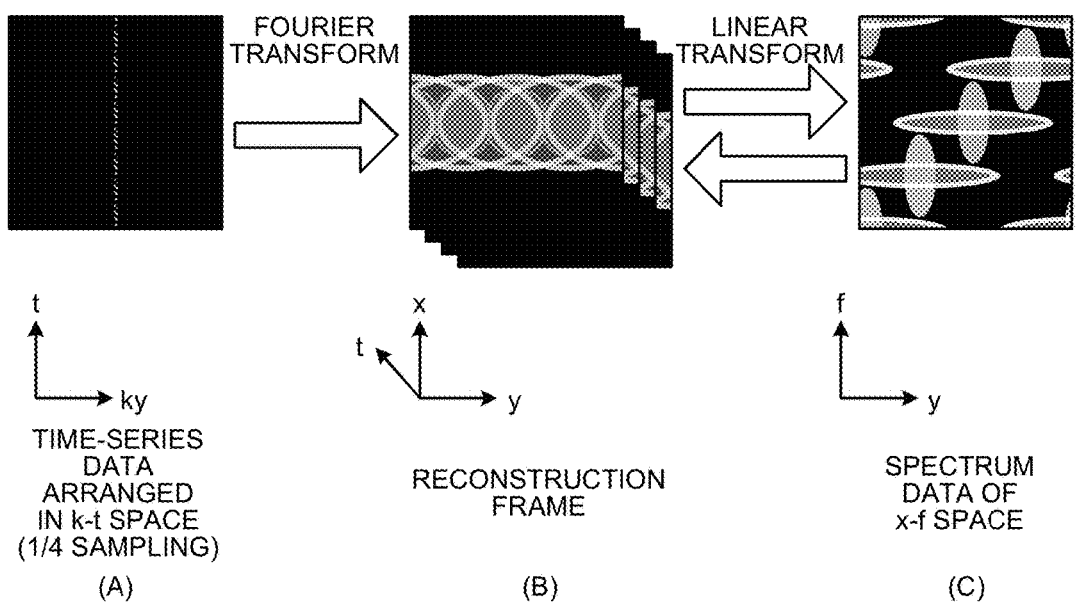
FIG. 3 is a diagram for explaining the k-t space and the x-f space in the present embodiment.

FIG. 3 is a diagram for explaining the k-t space and the x-f space in the present embodiment similarly to FIG. 2; however, a case where data is arranged only at some of sampling points, not a case of full sampling, is assumed. Specifically, as described later, data is arranged only at some of the sampling points out of the full sampling points with respect to at least one direction in a space in which a space in the time direction (hereinafter, time space) and an image space are integrated in the present embodiment. Points at which no data is arranged (data is not sampled) can be for any of the directions. The image space includes cases of the two-dimension and the three-dimension. Furthermore, the directions in the image space include, for example, a phase encode direction and a direction perpendicular thereto. For example, FIG. 3(A) shows time-series data that is arranged in the k-t space in 1/4 sampling in the phase encode direction. 1/4 sampling is to arrange data only at one sampling point, excluding three sampling points, out of four sampling points. In this case, as show in FIG. 3(B), fold-over appears in a reconstruction image. Moreover, as shown in FIG. 3(C), such fold-over appears also in spectrum data in the x-f space.

Figure 4:
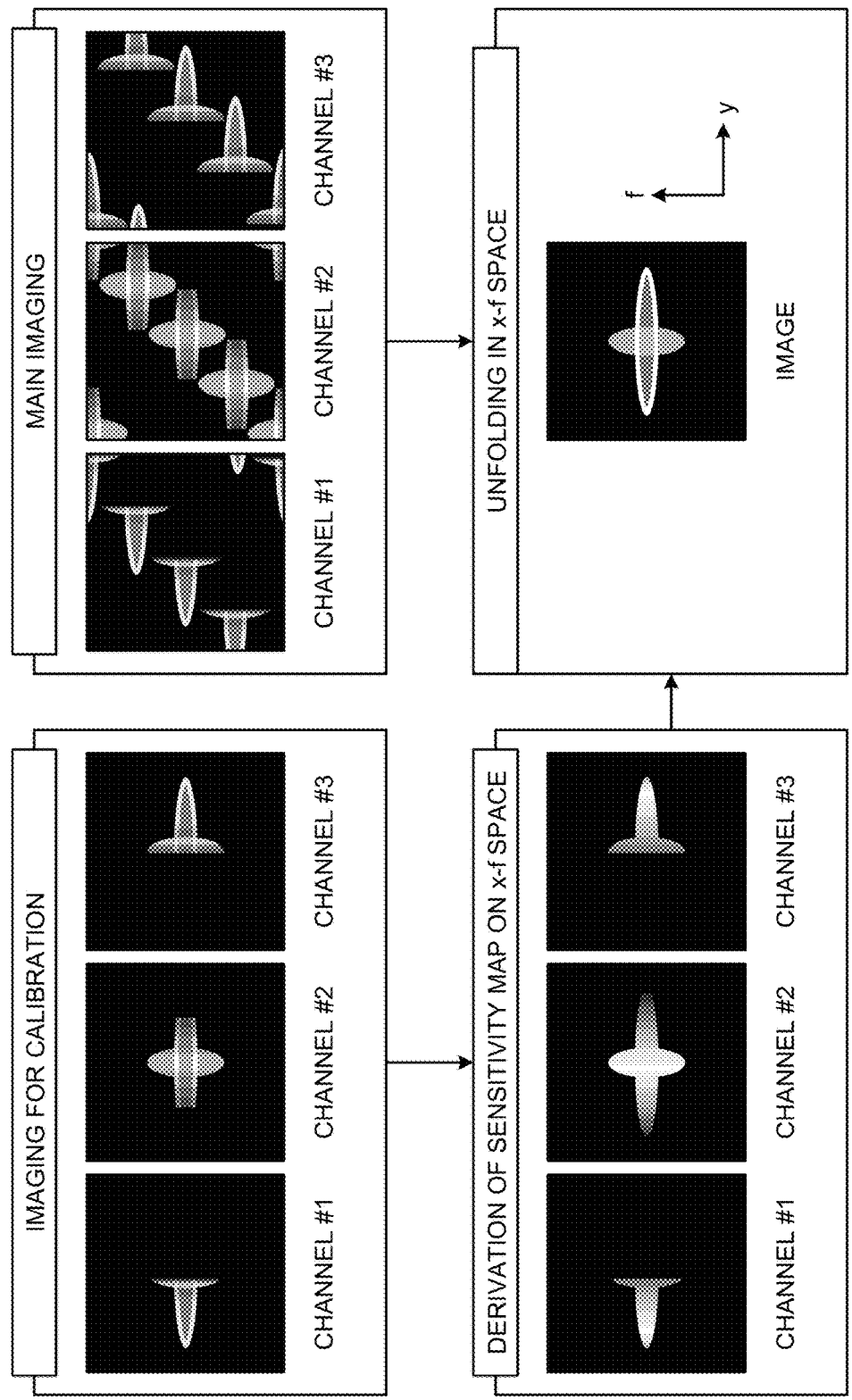
FIG. 4 is a diagram for explaining image generation in k-t SENSE.

FIG. 4 is a diagram for explaining image generation in the k-t SENSE. As described above, when data is arranged only at some of sampling points not performing full sampling, fold-over appears in spectrum data in the x-f space. To unfold this fold-over in the x-f space to generate an image, a sensitivity map in the x-f space is required. Therefore, in the k-t SENSE, as shown in FIG. 4, imaging for calibration is performed separately from main imaging to collect data for diagnostic images, and a sensitivity map of the x-f space is derived from calibration data acquired for each channel. Thereafter, the inverse Fourier transform is performed using data collected in each channel by the main imaging and the sensitivity map of the x-f space, and the fold-over is developed in the x-f space to generate an image.

Figure 5:
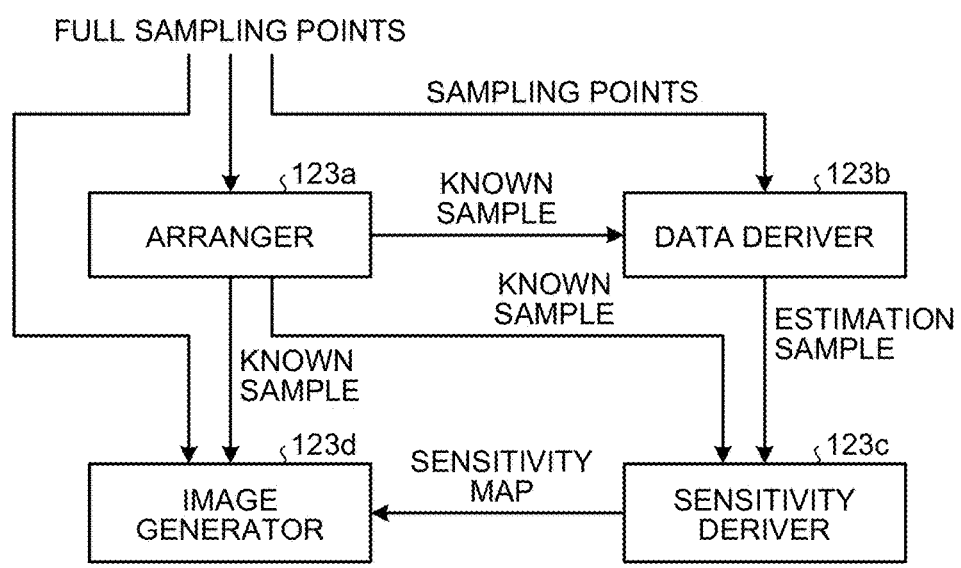
FIG. 5 is a block diagram for explaining a controller according to the present embodiment.
Figure 6:
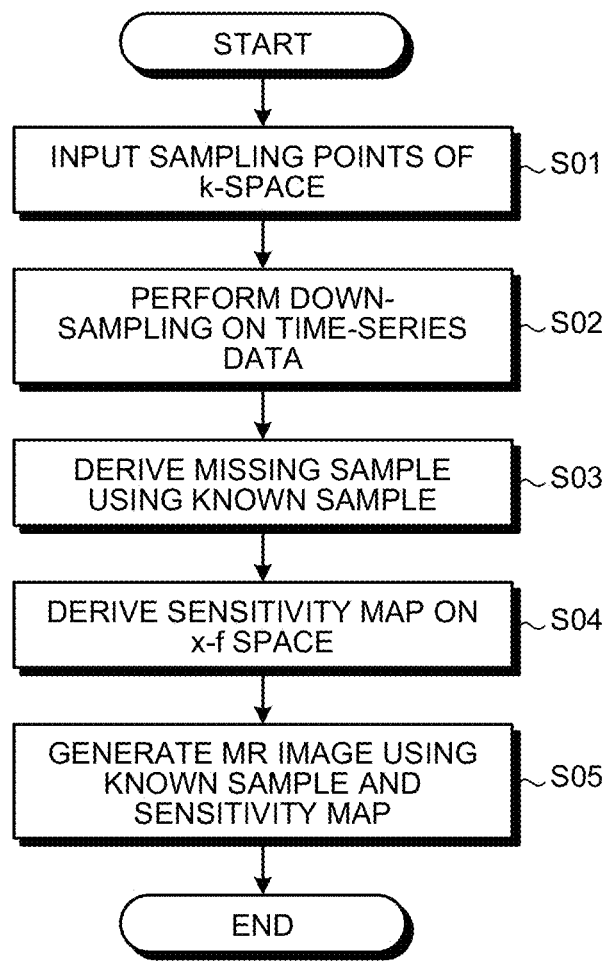
FIG. 6 is a flowchart showing a processing procedure according to the present embodiment.

FIG. 5 is a block diagram for explaining the controller 123 according to the present embodiment, and data communicated among respective components is shown. FIG. 6 is a flowchart showing a processing procedure according to the present embodiment. In the present embodiment, sampling is performed down-sampling for full sampling points based on a criterion determined separately. The point at which time-series data is arranged is called "sampling point", and the point at which no time-series data is arranged is called "non-sampling point (down-sampling point)". Furthermore, the "sampling point" is a point in a grid form (Cartesian grid) arranged in the k space unless otherwise specified.

Step S01: First, full sampling points of the k-space are given. In the present embodiment, the full sampling points of the k-space are determined, for example, based on an imaging parameter such as FOV (field of view) and an imaging resolution, and are determined with respect to each of the time direction in the time space, the phase encode direction in the image space, and the direction perpendicular thereto, as necessary. Moreover, as shown in FIG. 5, information about the full sampling points and the sampling points of the k-space is input to respective components of the arranger 123a, the data deriving unit 123b, and the image generator 123d for processing to be described later.

Step S02: Subsequently, the arranger 123a arranges the time-series data stored in the storage unit 122 at a sampling point of the k-space. At this time, the arranger 123a performs down-sampling based on a criterion determined separately, on the full sampling points that are given at step S01. For convenience of explanation, the time-series data arranged at a sampling point is called "known sample".

Step S03: Next, the data deriving unit 123b derives time-series data at a non-sampling point at which a known sample is not arranged at step S02 out of the full sampling points given at step S01. For convenience of explanation, the time-series data that is not sampled and not arranged is called "missing sample". For example, the data deriving unit 123b estimates a missing sample using the known sample arranged at a sampling point by the arranger 123a, or sets the missing sample to "zero". For convenience of explanation, the time-series data that is derived by the data deriving unit 123b is called "estimation sample".

Step S04: Subsequently, the sensitivity deriver 123c derives a sensitivity map of each channel in the x-f space using time-series data in which the known sample arranged at the sampling point by the arranger 123a and the estimation sample derived by the data deriving unit 123b are combined.

Step S05: Then, the image generator 123d generates time-series MR images using the known sample arranged at the sampling point by the arranger 123a and the sensitivity map derived by the sensitivity deriver 123c. For example, the image generator 123d sets "zero" to a missing sample with respect to the time-series data that is arranged in the k-space at step S02. The image generator 123d then performs the Fourier transform for each frame on the time-series data of each channel, and further performs transformation (for example, the Fourier transform) in the time direction, thereby acquiring spectrum data of the x-f space of each channel. Subsequently, the image generator 123d develops this spectrum data using the sensitivity map of each channel that is derived similarly in the x-f space, and performs, in the time direction, inverse transformation of the transformation (for example, the Fourier transform) previously applied on the data acquired by development, thereby generating an MR image. The two-phase technique in which the image generator 123d performs the Fourier transform for each frame on the time-series data of each channel, and then performs the transformation in the time direction has been explained. However, the present embodiment is not limited thereto. For example, the image generator 123d can perform a computation including an operation to perform the Fourier transform for each frame on the time-series data in one-phase processing (for example, fast Fourier transform) to transform in the time direction. Furthermore, similarly, as for the operation of setting "zero" to the missing sample, the image generator 123d can perform a computation corresponding to this operation in one-phase processing (for example, fast Fourier transform) to transform in the time direction. As described, each step to generate an MR image can be executed as a computation included in predetermined processing as appropriate.

As described, by performing the processing procedure shown in FIG. 6, time-series MR images are generated. A Specific example of each step is described later.

Arrangement by the arranger 123a is explained. First, in the present embodiment, the arranger 123a arranges, in the k-space, time-series data that is acquired by imaging by the sequence controller 110 and is stored in the storage unit 122. Arrangement in the present embodiment is "down-sampling" in which time-series data is arranged only at some of the sampling points out of the full sampling points as described below, and how the sequence controller 110 has collected the time-series data does not matter. For example, even when a part of data that is regarded as a known sample at a certain time is a one filled using another known sample that has been collected at another time different from that time, the present embodiment is applicable. For example, it is assumed that at a first time, only the central portion is collected without collecting the peripheral portion of the k-space. On the other hand, it is assumed that at a second time, the peripheral portion is collected. In this case, the arranger 123a can use the peripheral portion collected at the second time as time-series data of the first time to arrange in the k-space.

Generally, in high-speed imaging by MRI, when k-space data is to be imaged separately in the frequency encode direction and in the phase encode direction, imaging is performed down-sampling in the phase encode direction not in the frequency encode direction. In the present embodiment, as an arrangement pattern to arrange time-series data in the k-space in a down-sampling manner, for example, sampling points in the phase encode direction at each time should be determined.

Figure 7:
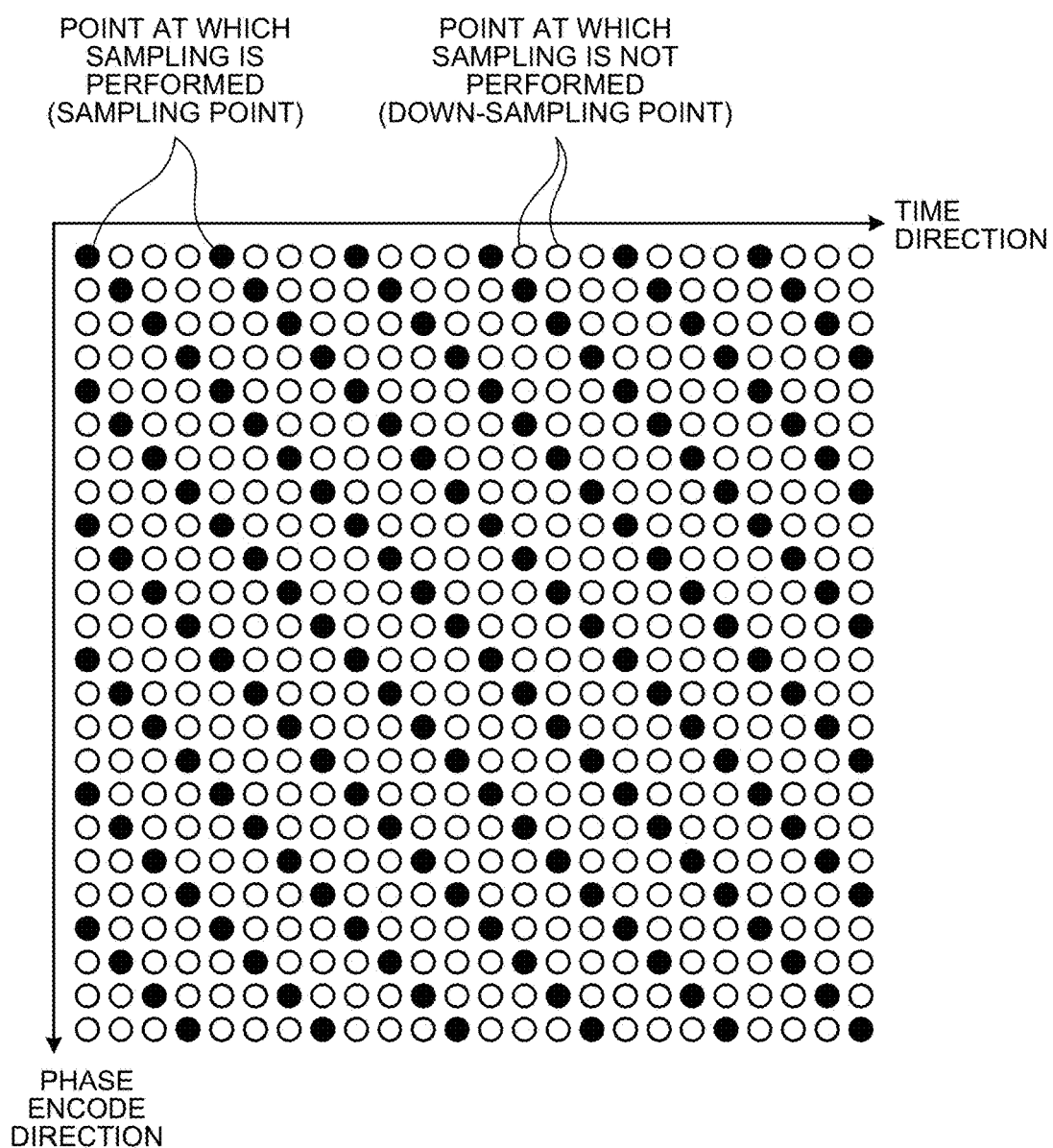
FIG. 7 is a diagram showing an example of sampling points in the present embodiment.

FIG. 7 is a diagram showing an example of the sampling points in the present embodiment. In FIG. 7, black circles indicate "sampling points" and white circles indicate "non-sampling points". FIG. 7 shows an example of arrangement in the two-dimensional k-space that is constituted by a one-dimensional frequency encode direction and a one-dimensional phase encode direction. The downward vertical direction is the one-dimensional phase encode direction, and the rightward horizontal direction is the one-dimensional time direction. Because down-sampling is not performed in the frequency encode direction for each sampling point in the phase encode direction, the frequency encode direction is omitted in FIG. 7. Moreover, when respective times are compared, sampling of the time-series data is performed at a point shifted in the phase encode direction by one sample from the next previous time. In other words, the arranger 123a arranges time-series data at shifted points so that the sampling points of chronologically sequential frames vary, in a predetermined direction (for example, the phase encode direction) in the k-space. As a result, as shown in FIG. 7, the time-series data is arranged every four samples in the time direction. If sampling is performed regularly as shown in FIG. 7, for the time-series data that is the data of respective time chronologically aligned, sampling of period 4 is performed in either of the phase encode direction and the time direction.

Although in this example, sampling points are shifted by one sample every one unit time, for example, in 1/4 sampling, sampling can be performed from another point such that the same sampling point comes every four unit times. For example, if respective points in the phase encode direction are called "1", "2", "3", and "4" for convenience of explanation, in the example shown in FIG. 7, the sampling points of the respective times are shifted as "1", "2", "3", "4", "1", "2", "3", "4". However, for example, sampling can be performed changing the sampling points as appropriate such that the sampling points of the respective times are shifted as "4", "3", "2", "1", "4", "3", "2", "1", or "1", "3", "2", "4", "1", "3", "2", "4". As described in the previous examples, in the present embodiment, sampling is performed such that the sampling has some kind of periodicity, and that nearly the entire part of an image space is filled (it is not necessarily required to be the entirety of the image space and, for example, zero can be filled in a peripheral portion) when sampling of each time is put together in a periodic unit. Furthermore, also when arranging in a three-dimensional k-space, the arranger 123a can arrange time-series data in a manner of the down-sampling similarly. As for an arrangement pattern in a case of three-dimensional k-space, sampling points may be determined, for example, such that out of the two-dimensional phase encode directions (for convenience sake, a first direction is called a phase encode direction, and a second direction perpendicular thereto is called a slice encode direction) that are perpendicular to the frequency encode direction, for the one-dimensional phase encode direction, sampling points are the same at all of the times, and for the remaining one-dimensional phase encode direction, the arrangement pattern is similar to the one shown in FIG. 7. Embodiments are not limited to this form, and a direction in which down-sampling is performed can arbitrarily be changed when down-sampling is performed in at least one direction in a space in which the time space and the image space are integrated. For example, the arranger 123a can perform down-sampling in the frequency encoded direction.

Derivation of a missing sample by the data deriving unit 123b is explained. In the present embodiment, derivation of a missing sample performed by the data deriving unit 123b is called "view sharing". Generally, view sharing is a technique to estimate a value of a missing sample using a known sample close to the missing sample; however, in the present embodiment, the view sharing includes an operation that values of missing samples are all set to "zero".

Figure 8:
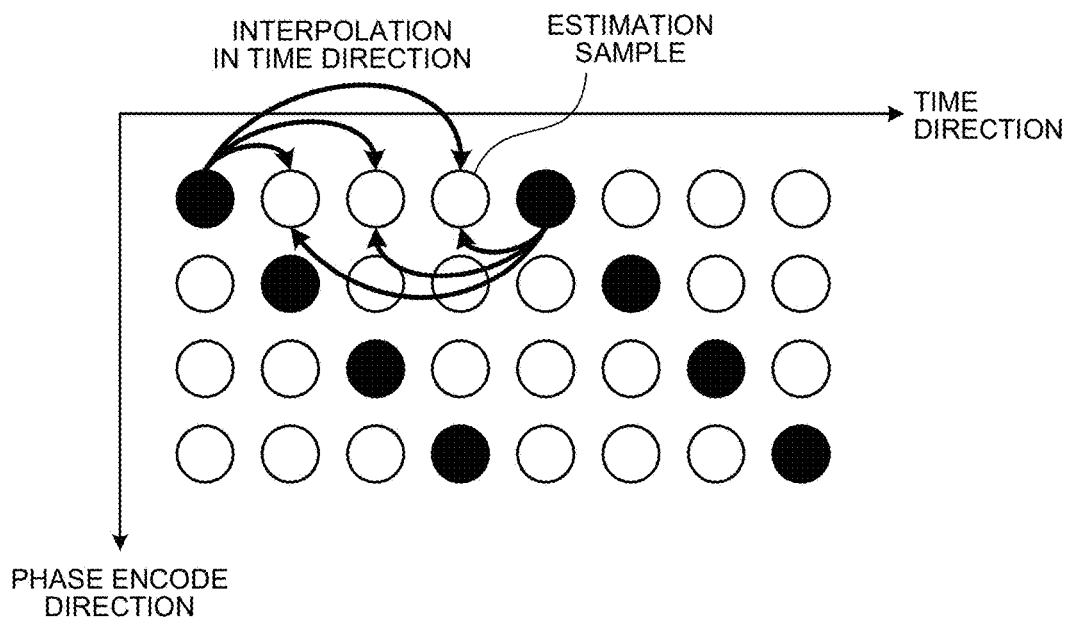
FIG. 8 is a diagram for explaining derivation of a missing sample in the present embodiment.

FIG. 8 is a diagram for explaining derivation of a missing sample in the present embodiment. FIG. 8 shows an example of estimating a value of a missing sample using two known samples that are present at times close to the time of the missing sample. For example, the data deriving unit 123b performs interpolation (for example, linear interpolation) in the time direction using two known samples to estimate a value of a missing sample. The number of known samples to be used for interpolation is not limited to two, and it can be an arbitrary number. For example, as techniques to perform linear interpolation in the time direction using four known samples, there are techniques called bicubic interpolation and a cubic convolution interpolation.

Figure 9:
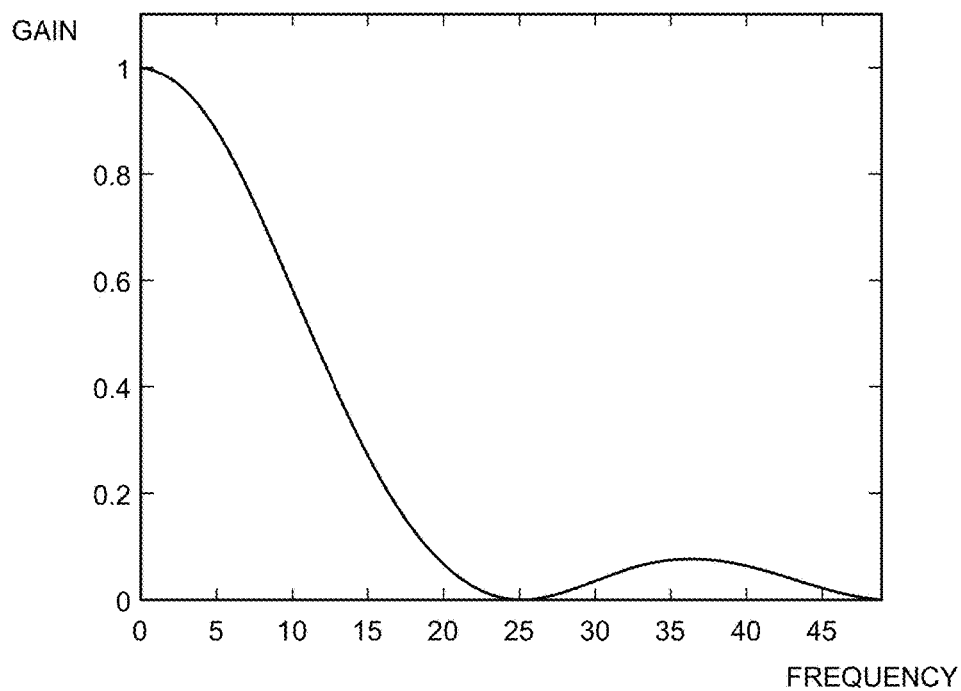
FIG. 9 is a diagram showing an example of an FIR (fine impulse response) filter in the present embodiment.

Moreover, for example, the data deriving unit 123b can copy the closest known sample to use as the value of the missing sample. Furthermore, for example, the data deriving unit 123b can derive a missing sample applying a time-direction FIR filter. In this case, for example, the data deriving unit 123b sets a missing sample to "zero", and performs scaling on the size of a known sample to match an unknown sample (missing sample). For example, the data deriving unit 123b performs scaling on a value of each known sample to quadruplicate when 1/4 down-sampling is performed with respect to full sampling. The data deriving unit 123b then applies a time direction FIR filter the lower gain of which is larger than the higher gain thereto. FIG. 9 is a diagram showing an example of the FIR filter in the present embodiment. In FIG. 9, values given on the frequency axis indicate frequency values when the number of entire samples is 100.

If a little reduction in the imaging speed is permissible, for example, the data deriving unit 123b can image samples (hereinafter, time calibration samples) in predetermined points (for example, several lines near the central portion of the k-space) in the phase encode direction at all of the times. The data deriving unit 123b can then calculate an interpolation coefficient to perform interpolation for each missing sample in the time direction from the calibration samples, and can interpolate the missing sample using the calculated interpolation coefficient.

Correction of a sensitivity map by the sensitivity deriver 123c is explained. To perform parallel imaging in the time space (for example, the x-f space), in the present embodiment, transformation is performed in the time direction on a reconstruction frame that is reconstructed by the Fourier transform. Although in the present embodiment, explanation is given assuming that the transformation in the time direction is the Fourier transform, embodiments are not limited thereto, and the transformation is not required to be the Fourier transform as long as it is the transformation in the time direction.

In parallel imaging such as SENSE and SMASH (simultaneous acquisition of spatial harmonics) that uses a sensitivity of a channel, the sensitivity of each channel is calculated for each pixel based on a reconstruction image that is acquired by performing imaging for calibration in advance, and an aliasing signal that occurs when a missing sample is reconstructed as it is removed using the sensitivity. The sensitivity of each pixel is calculated, for example, with reference to a coil called body coil, as a ratio between a value acquired at each channel and a value acquired by the body coil. Furthermore, the sensitivity of each pixel can be acquired, for example, by calculating a root sum square of values acquired at all of the channels, and for example, by considering that as a value acquired by the body coil.

In the present embodiment, derivation of the sensitivity map (time-space sensitivity map) of each channel goes through the process of generating k-space data for deriving a sensitivity map at steps S01 to S03 shown in FIG. 6, deriving a sensitivity map at step S04, and performing parallel imaging using the sensitivity map at step S05.

Therefore, the deriving technique of the sensitivity map at step S04 can be, for example, the same technique as the existing one for deriving the sensitivity map that is used for parallel imaging. Specifically, in the present embodiment described below, after deriving a tentative sensitivity map by the existing technique same as that of parallel imaging, correction is performed on the derived sensitivity map, and thereby acquiring the final sensitivity map to be used for generation of an MR image. However, the present embodiment is not limited thereto, and omitting the correction, for example, a ratio between a value acquired at each channel and a root sum square of values acquired at all of the channels can be used as the sensitivity map.

At step S04, for estimation of the sensitivity map (time-space sensitivity map), not only a known sample but also an estimation sample is used. The estimation sample can have severe error because the estimation sample has, for example, values estimated by view sharing explained previously. Accordingly, if the existing estimation of the sensitivity map used for parallel imaging is applied, the acquired sensitivity value can have a severe error also.

Therefore, as a technique to reduce an estimation error of the time-space sensitivity map, the sensitivity deriver $123c$ according to the present embodiment first derives a tentative time-space sensitivity map, and corrects this tentative time-space sensitivity map using a space sensitivity map that is derived separately, to derive the final sensitivity map. At this time, the sensitivity deriver $123c$ does not consider time variation of the space sensitivity value at all. In other words, it is assumed that the space sensitivity value does not vary in the time direction. The space sensitivity value (space sensitivity map) that is assumed not to vary in the time direction is hereafter called "space sensitivity value (space sensitivity map) independent of the time direction" in some cases for convenience of explanation. To perform parallel imaging in the time space, in the present embodiment, transformation in the time direction is performed on a reconstruction frame that is reconstructed by the Fourier transform. This transformation is "a linear transformation", and as a property of linear transformations, adding and subtracting after multiplying two or more numbers by an identical coefficient is equal to adding and subtracting and then multiplying the result thereof by the identical coefficient. If the time variation of the space sensitivity value is not considered at all, the space sensitivity values of the reconstruction frames at respective times are identical. Therefore, the time-space sensitivity value after linear transform in the time direction is performed thereon is to be equal to the space sensitivity value at each time. Accordingly, the sensitivity deriver $123c$ corrects the tentative time-space sensitivity map using this property. Specifically, the sensitivity deriver $123c$ acquires the space sensitivity value independent of the time direction, and corrects the time-space sensitivity value of the tentative time-space sensitivity map as appropriate using this space sensitivity value.

$$Lt(kI(x,y,z,t))=kLt(I(x,y,z,t))$$

Lt: one-dimensional linear transform in the time direction
k: the space sensitivity value independent of time
I(x, y, z, t)=space points (x, y, z), pixel value of time t Derivation of the space sensitivity map independent of the time direction is explained herein. For example, the sensitivity deriver $123c$ calculates, for the tentative time-space sensitivity map of each channel derived previously, a weighted mean of respective time-space sensitivity values in the time direction for each space pixel using a weight value determined separately. The value of weighted mean derived by the sensitivity deriver $123c$ is the space sensitivity value independent of the time direction. Moreover, the sensitivity deriver $123c$ uses the space sensitivity value derived for the space pixel of interest of the channel of interest as the time-space sensitivity value after the same space pixel of the same channel is transformed in the time direction, to correct the time-space sensitivity map. Not substituting the calculated weighted mean as it is for the corresponding time-space sensitivity value, for example, the sensitivity deriver $123c$ can calculate a weighted sum of the value of the calculated weighted mean and the time-space sensitivity value of the tentative time-space sensitivity map using a weight value determined separately, to use as the time-space sensitivity value after correction.

Derivation of a binarized sensitivity map by the sensitivity deriver $123c$ is explained providing three specific examples. In SENSE, the performance can be improved by setting the sensitivity of a pixel without a signal to "zero (0)". However, for the data acquired by view sharing, the reliability of data that has a high period in the time direction is lowered. Accordingly, applying threshold processing to the data acquired by view sharing and setting the time-space sensitivity value to "zero" have possibility that the sensitivity at a point having sensitivity is set to "zero". To improve the estimation precision of the time-space sensitivity, it is preferable that a point having sensitivity of not "zero" is estimated. Specifically, for example, a binarized sensitivity map that indicates whether sensitivity is "zero" is derived by a technique to be described later, and the sensitivity at a point where sensitivity is not present can be set to "zero".

Figure 10:
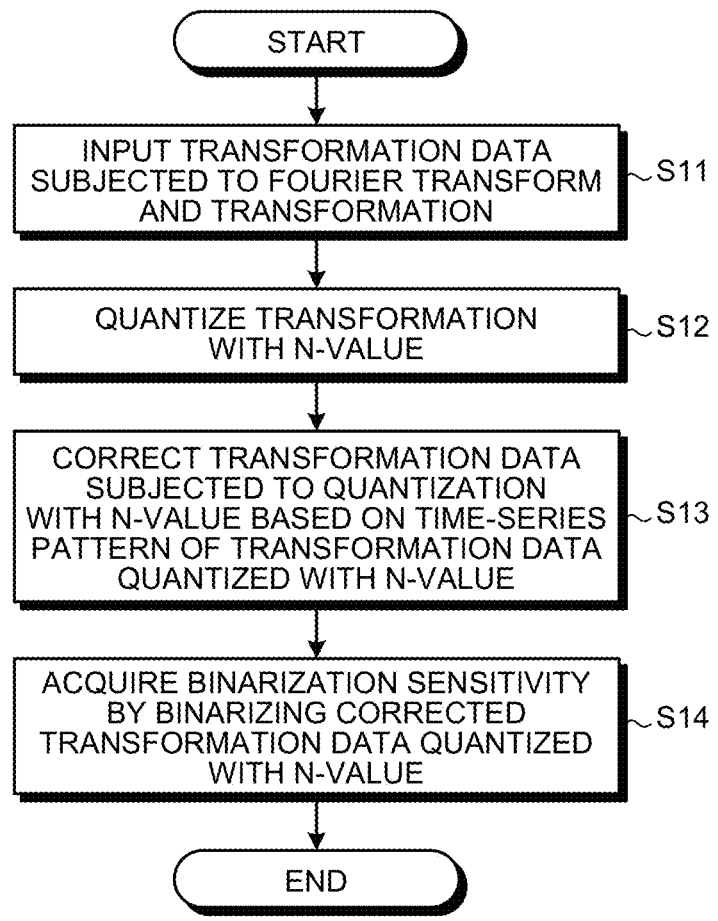
FIG. 10 is a flowchart of a processing procedure to derive a binarized sensitivity map in the present embodiment.
Figure 11:
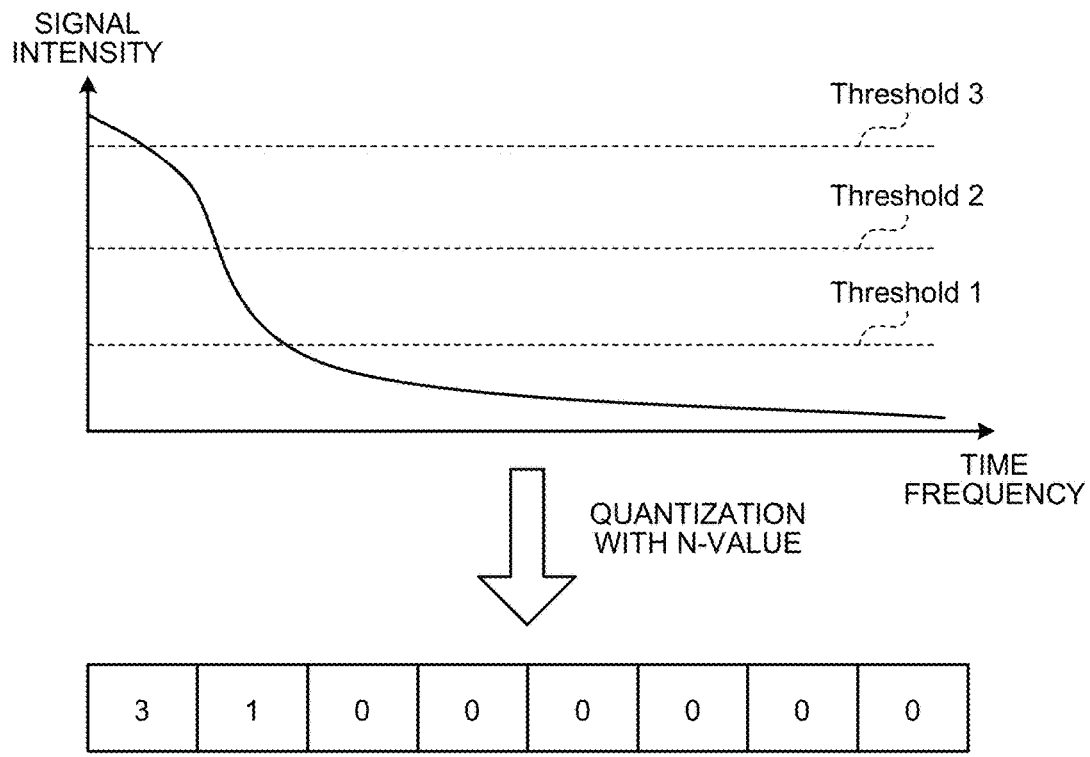
FIG. 11 is a diagram for explaining derivation of the binarized sensitivity map in the present embodiment.
Figure 12:
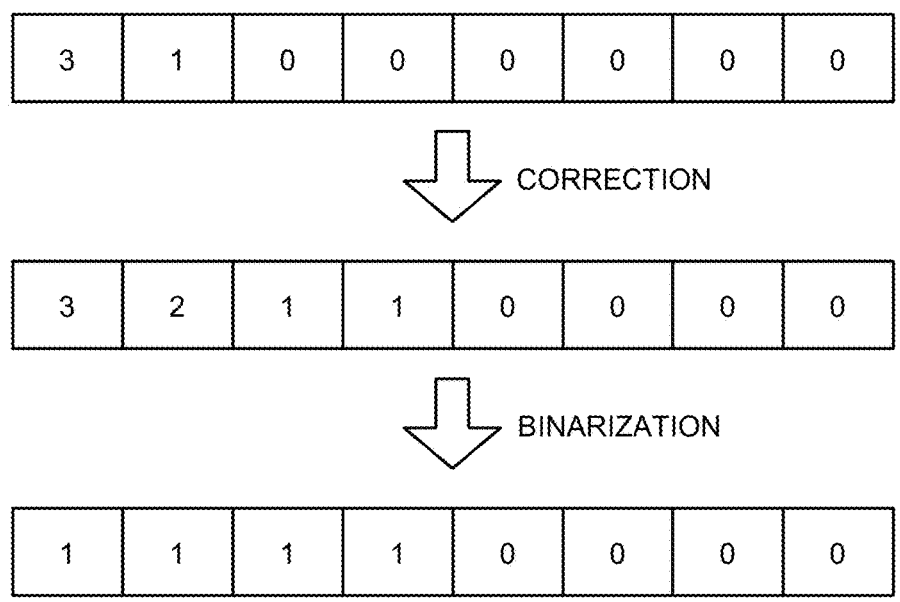
FIG. 12 is a diagram for explaining derivation of the binarized sensitivity map in the present embodiment.
Figure 13:
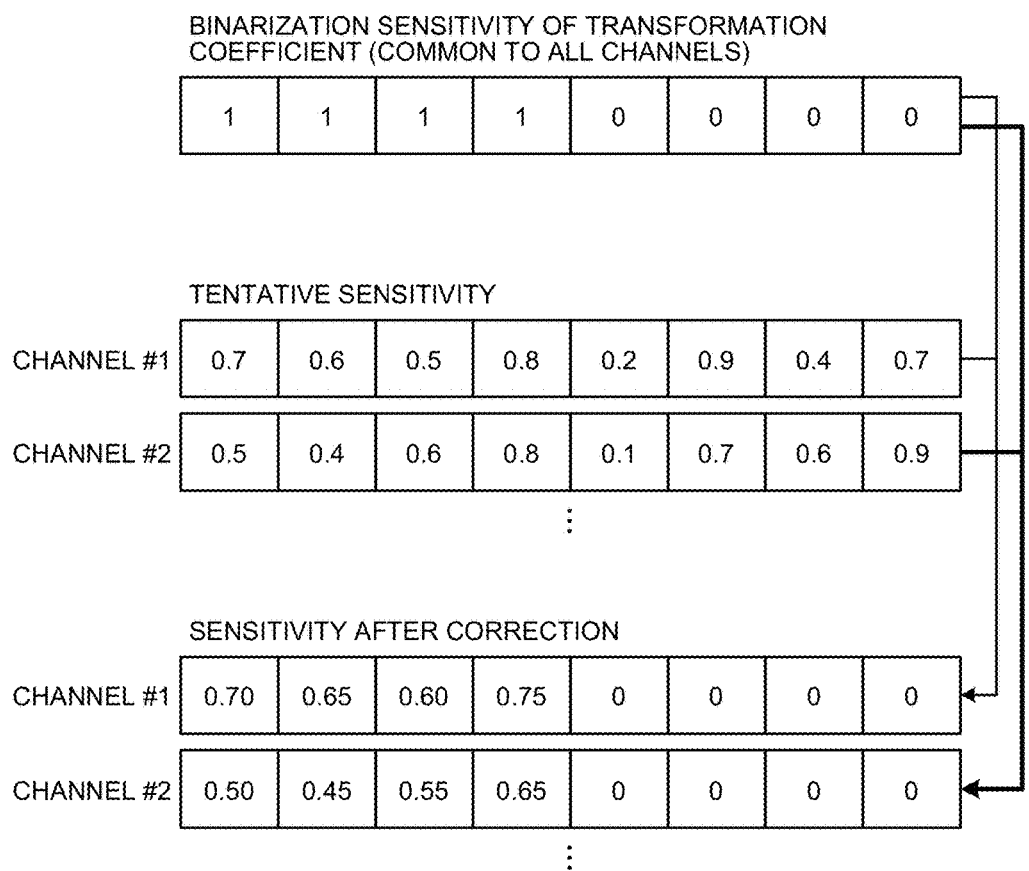
FIG. 13 is a diagram for explaining derivation of the binarized sensitivity map in the present embodiment.

FIG. 10 is a flowchart showing an example of a processing procedure to derive the binarized sensitivity map in the present embodiment. Moreover, FIGS. 11 to 13 are diagrams for explaining derivation of the binarized sensitivity map in the present embodiment. It is described later but the binarized sensitivity map can be directly estimated without going through the sensitivity map that is quantized with multiple values.

Step S11: The sensitivity deriver $123c$ acquires a coefficient value (transformation data) after linear transform by performing the Fourier transform on time-series data of each channel for each frame, and by further performing transformation in the time direction (for example, the Fourier transform). When the transformation is the Fourier transform, the Fourier transform of the time space can be applied to the time-series data. In other words, although a two-step technique in which time-series data of each channel is Fourier transformed for each frame and then transformed in the time direction has been explained, the present embodiment is not limited thereto. For example, a computation including an operation of performing the Fourier transform on time-series data for each frame in one-step processing to transform in the time direction (for example, fast Fourier transform) can be performed.

Step S12: Subsequently, the sensitivity deriver $123c$ quantizes the coefficient value acquired at step S11 with N-value as shown in FIG. 11. The quantization is not necessarily required to be linear quantization, and it can also be binarization.

Step S13: Next, the sensitivity deriver $123c$ corrects a quantization pattern using a pattern of the coefficient value in the time direction as shown in FIG. 12. As an example of step S13, there is a method in which the sensitivity deriver $123c$ prepares a database in which sets of coefficient value patterns before correction and after correction are recorded, and searches the closest coefficient value pattern before correction from the database and then outputs a coefficient pattern after correction. The database can be tuned manually or can be created in advance by machine learning. When created in advance by machine leaning, for example, learning data of full sampling is prepared, and sets of binarized sensitivity generated from data of full sampling and binarized sensitivity generated by artificially simulating a down-sampling process and view sharing are clustered, if it is necessary to reduce the data amount, and stored in the database for the leaning data.

Step S14: Next, the sensitivity deriver 123c acquires binary sensitivity applying a threshold to the output data of N-value. If the threshold used at step S14 is fixed, the sensitivity deriver 123c can output the binarized sensitivity simply at step S13 combining steps S13 and S14.

When binarization is directly performed using a database without going through N-value quantization, binarization can also be performed by a method described next.

Step 1 (Direct Binarization): A coefficient value (transformation data) after transformation is acquired by the same procedure as step S11.

Step 2 (Direct Binarization): The sensitivity deriver 123c performs binary quantization on the coefficient value acquired at step 1.

Step 3 (Direct Binarization): The sensitivity deriver 123c corrects a quantization pattern using a pattern of the coefficient value in the time direction. This step takes the same process as step S13 in the case of going through multi-value quantization.

When binarization is directly performed using a continuous function without going through N-value quantization, the binarization can also be performed by a method described next.

Step 1 (Binarization Using a Function): A coefficient value after transformation (transformation data) is acquired by the same procedure as step S11.

Step 2 (Binarization Using a Function): A function (template function) the input of which is the time frequency and the output of which is a signal attenuation rate is given to the sensitivity deriver 123c. As a form of this function, for example, a hyperbolic function or an exponential function that attenuation is significant in a high frequency region of the time frequency compared to a low frequency region can be used, or an attenuation rate of each frequency can be calculated using full sampling data for learning that is prepared separately, and a function that is acquired by curving the attenuation rate with an interpolation function (for example, spline function) can be used. The output value of the template function is not signal intensity but a signal attenuation rate, and the signal intensity can be acquired by multiplying the signal attenuation rate by a parameter value.

Step 3 ((Binarization Using a Function): The sensitivity deriver 123c determines a parameter value of the template function such that, for example, a weighted squared error relative to the transformation data acquired at step 1 is small for each pixel. The weight of the weighted square error can be set such that weight in the low frequency region is larger compared to the high frequency region.

Step 4 (Binarization Using a Function): The sensitivity deriver 123c applies a threshold that is determined separately to a signal intensity acquired by multiplying an output value of the template function to each frequency by the parameter value for each pixel, thereby acquiring the binarized sensitivity.

FIG. 13 shows an example for explaining how sensitivity changes when correction of sensitivity is performed using the acquired binarized sensitivity. Correction of sensitivity herein is to derive the final sensitivity map by correcting a tentative time-space sensitivity map with a space sensitivity map that is derived separately. Moreover, in FIG. 13, "tentative sensitivity" refers to sensitivity that is calculated by the same method as parallel imaging using existing sensitivity (corresponding to a tentative time-space sensitivity map to be described later), and "binarized sensitivity of transformation coefficient" refers to binarized sensitivity acquired by the method described previously (corresponding to a binarized sensitivity map to be described later). First, an overview of sensitivity correction processing is explained. For example, the sensitivity deriver 123c performs a "first step of deriving a tentative time-space sensitivity map", a "second step of deriving a space sensitivity value independent of the time direction", a "third step of correcting the time-space sensitivity value by acquiring a weighted mean of the time-space sensitivity value derived at the first step and the space sensitivity value derived at the second step", and a "fourth step of setting the time-space sensitivity value of a time-space pixel the sensitivity of which is "zero" in the binarized sensitivity map to "zero"". The third step and the fourth step are identical to associating the tentative time-space sensitivity map and the binarized sensitivity map (mask) with each time-space pixel, correcting the time-space sensitivity of a time-space pixel that corresponds to mask "1" by acquiring a weighted mean with the space sensitivity value, and then setting the time-space sensitivity value of a time-space pixel that corresponds to mask "0" to "zero".

For example, the sensitivity deriver 123c, as the first step, calculates tentative sensitivity to channel #1 to acquire 0.7, 0.6, 0.5, . . . . The sensitivity deriver 123c, as the second step, estimates the space sensitivity value independent of the time direction (for convenience, referred to as time-fixed sensitivity). For example, in FIG. 13, the tentative sensitivity of a direct current component in the time direction is 0.7, and therefore, the time-fixed sensitivity can be set to 0.7. The sensitivity deriver 123c, as the third step, modifies (corrects) each time-space sensitivity to a weighted mean of the time-fixed sensitivity and each time-space sensitivity. For example, when the weight of both of them is 1, the sensitivity to channel #1 after correction is to be 0.70, 0.65, 0.60, . . . . The sensitivity deriver 123c, as the fourth step, sets the sensitivity of the time-space position the value of which in the binarized sensitivity map is "zero" to "zero". The same processing is applied also to channel #2 and following channels.

As another technique to set sensitivity of a pixel without a signal to "zero", there is a technique that sensitivity values at fold-over points on the sensitivity map are all extracted for respective sensitivity values that are overlapped because of the fold-over, a sensitivity value MaxS the absolute value of which is the largest thereamong is calculated, and when a value (hereinafter, referred to as "sensitivity attenuation rate") acquired by dividing the absolute value of each sensitivity value by MaxS is lower than a threshold value determined separately, the sensitivity is set to "zero".

Although the sensitivity value can be a tentative sensitivity value, an estimation sensitivity value based on learning data can also be used in the following method. In a learning phase, a sensitivity attenuation rate of a predetermined component (for example, a direct current component) in transformation in the time direction is calculated for each space point of the learning data, and a mean sensitivity attenuation rate thereof is calculated. In a learning-data using phase, first, a sensitivity value of the component determined in the learning phase in transformation in the time direction is extracted for each space position of input data. The time-space sensitivity value to a space point of interest is calculated by multiplying a sensitivity extracted at the space point of interest by the sensitivity attenuation rate acquired in learning. When the time-space sensitivity value is acquired, sensitivity values at fold-over points on the sensitivity map are all extracted, and an operation of setting the sensitivity value of a time-space point the sensitivity attenuation rate of which is lower than a threshold determined separately to "zero" can be applied. The operation of setting the sensitivity value to "zero" by these techniques can, of course, be combined with the method using the binarized sensitivity described previously.

If the technique of the present embodiment is used, the time-space sensitivity map can be generated only with main imaging data. Therefore, for example, calibration imaging is not required, and calibration is possible with less imaging data compared with the sampling pattern in which calibration imaging and main imaging are performed simultaneously. However, additional imaging is not denied. For example, a method in which imaging to consolidate with a knowledge is included in main imaging can be considered. For example, a method in which imaging for regularization data is added and regularization is performed using the data can also be used.

Alternatively, a technique as follows can also be used. After imaging for all frames in the central portion of the k-space, time-series vectors whose sample values in the k-space are known are aligned, and PCA (principal component analysis) is performed thereon. When reconstruction in the k-t space is performed, introducing such knowledge that time-series reconstruction data can be expressed with a weighted sum of vectors having large eigenvalues, for example, reconstruction in the k-t space and knowledge can be made mutually optimal.

When an apparatus according to the present embodiment is configured, the binarized sensitivity map is to be held besides the sensitivity map conventionally known (however, if a value corresponding to the binarized sensitivity map is generated and a sensitivity map value for a point at which the value of the binarized sensitivity map is zero is set to zero immediately, the binarized sensitivity map is not required to be held). Although these maps can be held for the entire time-space, processing at steps S103 to S110 to be described later need to be performed only for pixels used respective unfolding simultaneously. For example, when 1/4 down-sampling is performed, as can be seen in FIGS. 3(B) and FIG. 3(C), because the influence of fold-over signal of each pixel occurs only in four pixels, if processing of "applying S103 to S110 to four pixels" is repeated until all of the pixels are processed, a memory required for the sensitivity map and the binarized sensitivity map is only the amount required for processing four pixels, and thereby memory consumption can be suppressed.

Figure 14:
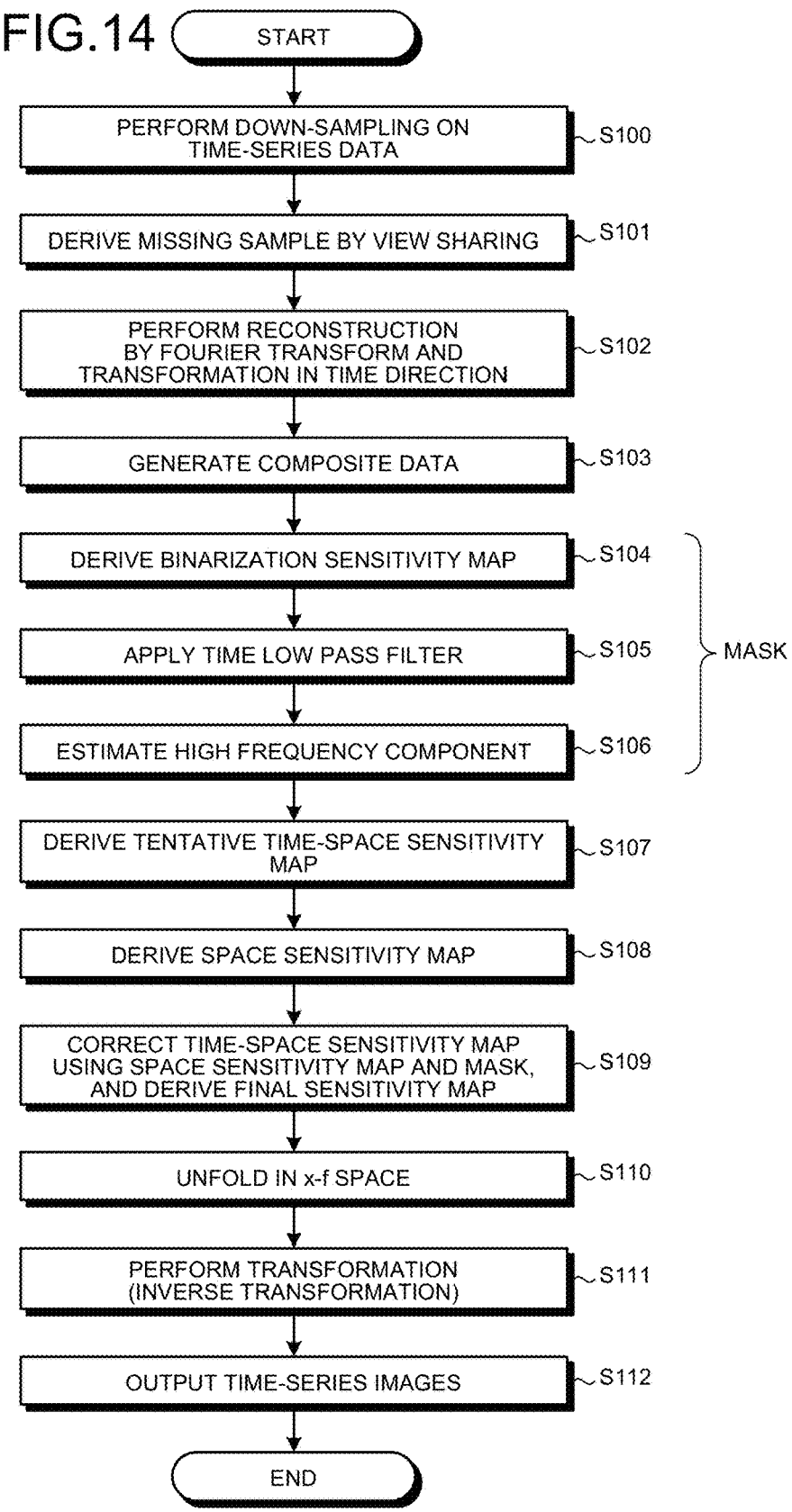
FIG. 14 is a flowchart of a processing procedure according to a specific example of the present embodiment.
Figure 15:
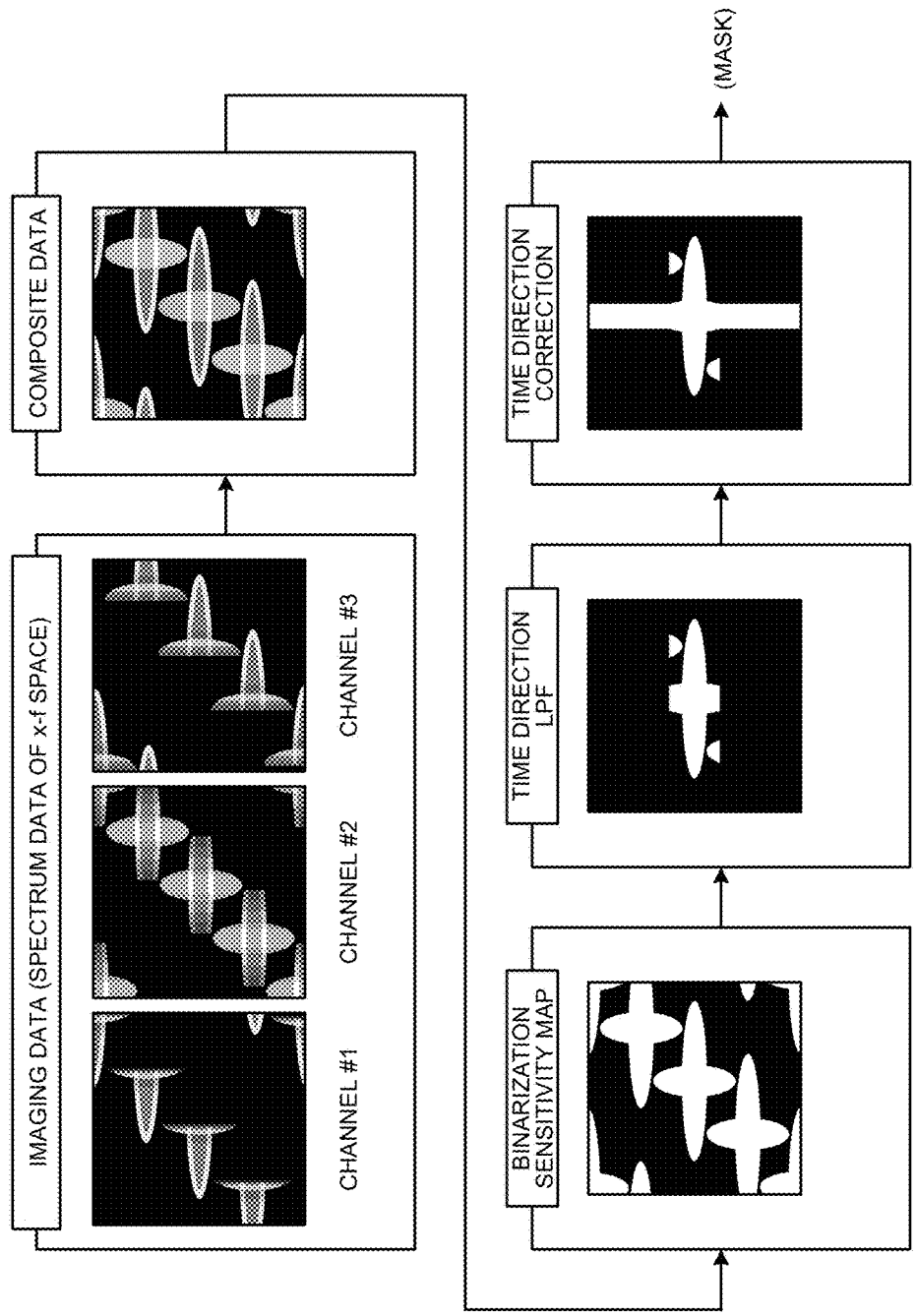
FIG. 15 is a diagram showing output in a specific example of the present embodiment.
Figure 16:
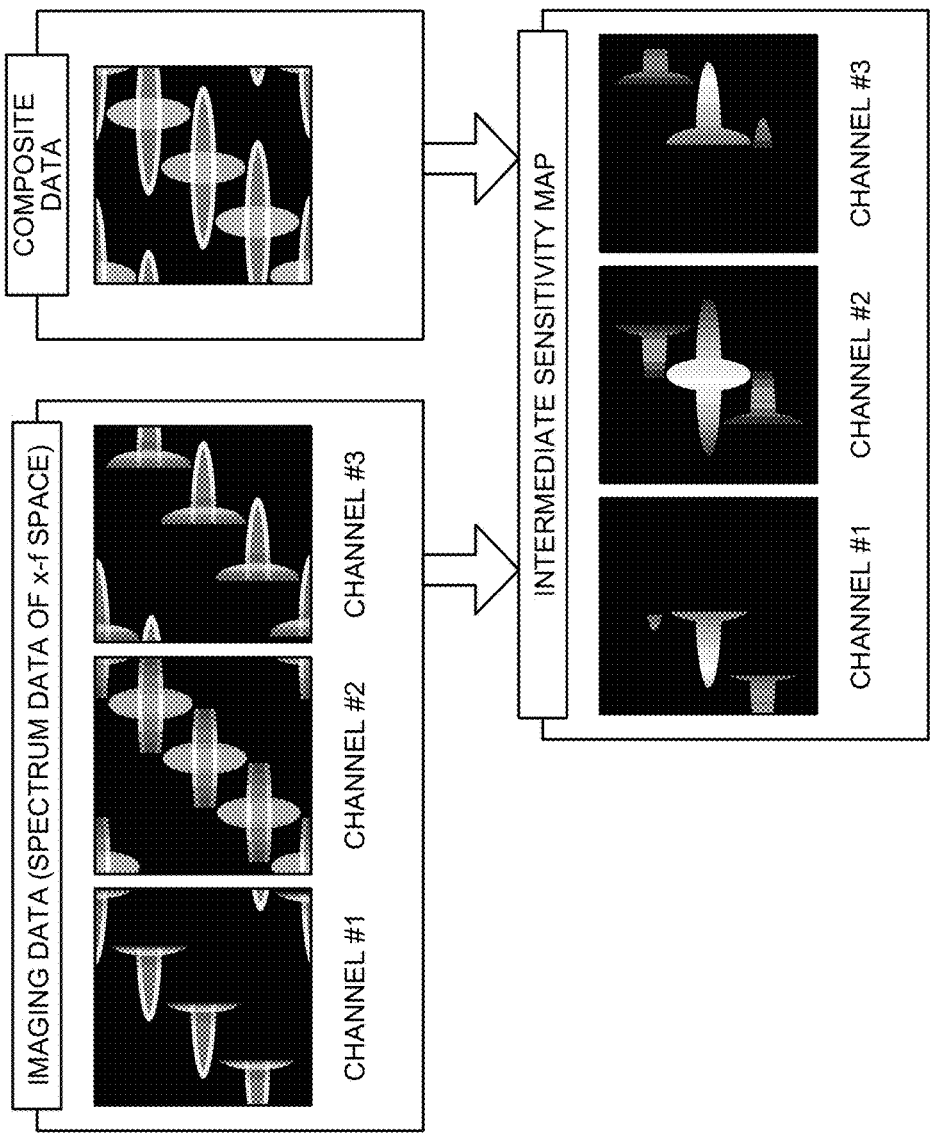
FIG. 16 is a diagram showing output in a specific example of the present embodiment.
Figure 17:
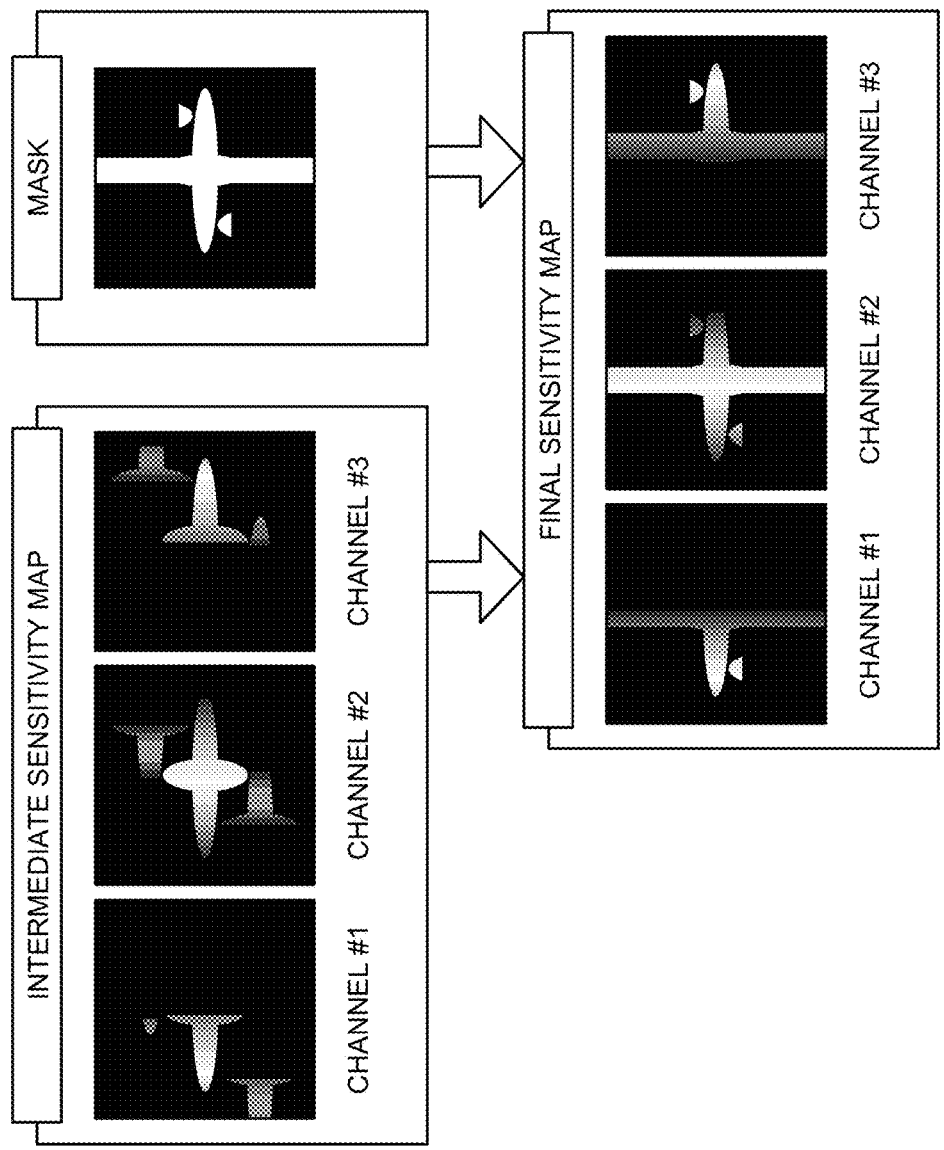
FIG. 17 is a diagram showing output in a specific example of the present embodiment.
Figure 18:
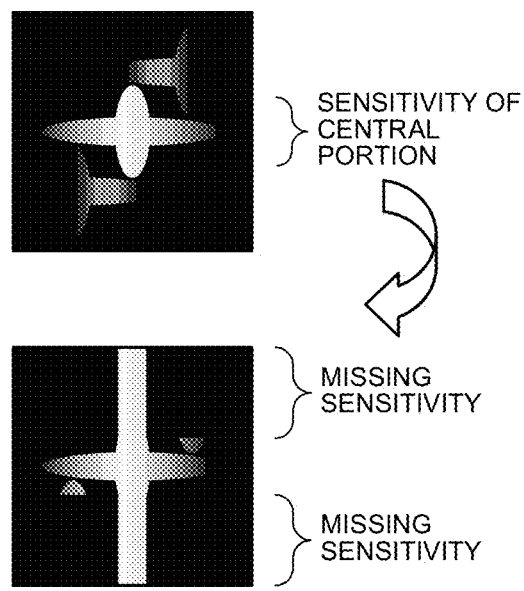
FIG. 18 is a diagram for explaining derivation of a final sensitivity map in a specific example of the present embodiment.

FIG. 14 is a flowchart of a processing procedure according to a specific example of the present embodiment. FIGS. 15 to 17 are diagrams showing output in a specific example of the present embodiment, and FIG. 18 is a diagram for explaining derivation of the final sensitivity map in a specific example of the present embodiment. A specific example explained below is merely an example, and the present embodiment is not limited to the specific example explained below. Moreover, in a processing procedure shown in FIG. 6, S01 to 03 correspond to a "preparation" stage, S04 corresponds to a "derivation of sensitivity map" stage, and S05 corresponds to a "generation of an MR image" stage. In a processing procedure shown in FIG. 14, S100 to 102 correspond to the "preparation" stage, S103 to 109 correspond to the "derivation of sensitivity map" stage, and S110 to S112 correspond to the "generation of an MR image".

(1) Preparation

Step S100: The arranger 123a performs down-sampling on the time-series data stored in the storage unit 122. For example, when the k-space is two dimensional, the arranger 123a applies full sampling points as the sampling points without down-sampling for the frequency encode direction, applies 1/4 sampling points for the phase encode direction, and shifts a sampling point of each time by one each in the phase encode direction. For example, the arranger 123a arranges time-series data as shown in FIG. 7. Although omitted in FIG. 7, the arranger 123a arranges respective time-series data of three channels, for Step S101: Subsequently, the data deriving unit 123b derives a missing sample of the time-series data. For example, the data deriving unit 123b estimates a missing sample by view sharing using a known sample arranged at a sampling point by the arranger 123a. Furthermore, for example, the data deriving unit 123b can simply set a missing sample to "zero". As an example of output shown in FIGS. 15 to 17, a missing sample is set to "zero".

(2) Derivation of Sensitivity Map

Step S102: Next, the sensitivity deriver 123c performs reproduction by the Fourier transform in the space direction using the known sample arranged at the sampling point at step S100 and the time-series data combined with the estimation sample derived at step S101, and performs transformation (for example, the Fourier transform) in the time direction. Thus, the sensitivity deriver 123c outputs imaging data (for example, spectrum data of the x-f space) of three channels as show in FIG. 15. The transformation in the time direction can be another type of transformation. In this case, the sensitivity deriver 123c outputs transformation data of the time-space not limited to the x-f space. Moreover, the transformation is not required to be orthogonal transformation.

Step S103: Subsequently, the sensitivity deriver 123c generates composite data. For example, the sensitivity deriver 123c generates the composite data by calculating RSOS (root sum of squares) of imaging data of three channels. Thus, the sensitivity deriver 123c outputs the composite data as shown in FIG. 15, for example. A signal present in imaging data of each channel is guaranteed to be included in this composite data. The generation of the composite data is not limited to RSOS. Furthermore, the composite data is regarded as a value acquired by a body coil, and is called "body coil image" in some cases. Furthermore, a body coil image can be used instead of the composite data.

Step S104: Next, the sensitivity deriver 123c derives the binarized sensitivity map indicating presence or absence of sensitivity. For example, the sensitivity deriver 123c derives the binarized sensitivity map by binarizing the composite data generated at step S103. Thus, the sensitivity deriver 123c derives the binarized sensitivity map as shown in FIG. 15, for example. A pixel that is indicated as "sensitivity present" in the binarized sensitivity map has a signal in at least one channel out of the three channels. As described above, the sensitivity map is not limited to be binary and can be of multiple values; however, in the specific example, a binary case is explained.

Step S105: Subsequently, the sensitivity deriver 123c applies a time low pass filter (LPF) to the binarized sensitivity map generated at step S104, and removes a fold-over signal in the time direction that is considered to be less reliable. The method of designing the time low pass filter is dependent on the transformation in the time direction. For example, when the transformation in the time direction is the Fourier transform, it is to be a filter to remove a signal at a point apart from the central portion of the x-f space. The sensitivity deriver 123c removes a fold-over signal in the time direction, for example, by removing signals except approximately ¼ of the central portion as shown in FIG. 15.

Step S106: Next, the sensitivity deriver 123c estimates a high frequency component in the time direction for the binarized sensitivity map from which the fold-over signal has been removed at step S105, thereby performing correction in the time direction. For example, the sensitivity deriver 123c estimates a high frequency component using a pattern of a low frequency component. Moreover, for example, the sensitivity deriver 123c calculates the sum of binarized sensitivity values of respective frequency components (for example, the sum of all frames, the sum of some frames around the time of interest, or the like), can estimate a high frequency component of each pixel assuming that when the value of the calculated sum is equal to or larger than a threshold determined separately, a high frequency component is present (that is, movement is involved), and when smaller than the threshold, a high frequency component is not present. As described, the sensitivity deriver 123c acquires the binarized sensitivity map corrected in the time direction as shown in FIG. 15, for example. This binarized sensitivity map is used as a mask at step S109 to be described later.

Step S107: Subsequently, the sensitivity deriver 123c derives a tentative time-space sensitivity map of each channel by dividing the imaging data (spectrum data in the x-f space) of each channel acquired at step S102 by the composite data acquired at step S103. The derived time-space sensitivity map is a sensitivity map that reliability in the high frequency region is higher compared to the low frequency region. In the present embodiment, for convenience of explanation, this sensitivity map is referred to as "intermediate sensitivity map". The sensitivity deriver 123c derives the intermediate sensitivity map as shown in FIG. 16, for example.

Step S108: The sensitivity deriver 123c then derives a space sensitivity map of a space sensitivity value independent of the time direction based on the tentative time-space sensitivity map (intermediate sensitivity map) derived at step S107.

Step S109: Next, the sensitivity deriver 123c corrects the time-space sensitivity map derived at step S107 using the space sensitivity map derived at step S108 and the mask (binarized sensitivity map), thereby deriving a final sensitivity map of each channel. The sensitivity deriver 123c derives the final sensitivity map as shown in FIG. 17, for example.

In this specific example, as for the time-space sensitivity value of a pixel for which a value cannot be acquired, the time-space sensitivity value is calculated assuming that "the time-space sensitivity value is equal to the space sensitivity value" or "the time-space sensitivity value is a function of a space sensitivity value determined separately". The space sensitivity is an actual sensitivity value that is acquired for each channel. On the other hand, the time-space sensitivity value is a virtual sensitivity value in the time-space. For example, the sensitivity deriver 123c associates the intermediate sensitivity map of channel #1 with the mask for each time-space pixel. In the intermediate sensitivity map of channel #1, a time-space pixel corresponding to a mask "0" indicates that the time-space sensitivity value is not present, and therefore, the sensitivity deriver 123c sets the time-space sensitivity value of this time-space pixel to "0". Meanwhile, in the intermediate sensitivity map, a time-space pixel corresponding to a mask "1" indicates that the time-space sensitivity value is present and unknown, and therefore, the sensitivity deriver 123c derives the time-space sensitivity value of this time-space pixel from the space sensitivity map. Moreover, for example, when as a highly reliable time-space sensitivity value in the intermediate sensitivity map, a time-space sensitivity value of one pixel among pixels in the central portion of the same intermediate sensitivity map is used, the sensitivity deriver 123c applies the time-space sensitivity value as it is as shown in FIG. 18. On the other hand, when as a highly reliable time-space sensitivity value in the intermediate sensitivity map, time-space sensitivity values of more than one pixel of the same intermediate sensitivity map are used, the sensitivity deriver 123c, for example, calculates a mean value of the time-space sensitivity values in the central portion of the intermediate sensitivity map, and applies the calculated mean value to target pixels in the peripheral portion as shown in FIG. 18.

(3) Generation of an MR Image

Step S110: Subsequently, the image generator 123d acquires spectrum data of the x-f space of each channel by performing, for each frame, the Fourier transform on the time-series data of each channel, and further performing transformation (for example, Fourier transform) in the time direction. Furthermore, the image generator 123d develops this spectrum data using the sensitivity map of each channel that is also derived in the x-f space.

Step S111: Next, the image generator 123d performs, in the time direction, inverse transformation of the transformation (for example, Fourier transform) that has been applied previously on data acquired by development to generate an MR image.

Step S112: Subsequently, the image generator 123d outputs the acquired time-series MR images. For example, the image generator 123d outputs to a storage in the MRI apparatus 100, a network storage that is connected to the MRI apparatus 100, or the display unit 125 included in the MRI apparatus 100.

Embodiments are not limited to the processing procedure describe above. For example, while an example in which steps S100 to S112 are sequentially executed has been explained in FIG. 14, embodiments are not limited thereto. For example, steps S104 to S106 relating to the mask generation processing can be performed independently from the other processing procedure shown in FIG. 14, and are only necessary to be performed before step S109, which is the processing using masks. Moreover, the composite data generated at step S103 is data used in the mask generation processing at steps S104 to S106, and is data used in the derivation processing of the tentative time-space sensitivity map at step S107. Therefore, the composite data is only required to be generated before performing these. As described, the processing procedure shown in FIG. 14 can be arbitrarily altered in the sequence, or can be performed in parallel, except the case where processing has dependency in the execution sequence.

Furthermore, generally, a sensitivity map is acquired as a ratio (PAC image/WBC image) between an image that is acquired by a whole body coil (hereinafter, WBC image) and an image that is acquired at each channel (hereinafter, PAC (phased array coil) image). Accordingly, in the present embodiment also, for example, for an acquired final sensitivity map of each channel, correction processing by dividing by a WBC image, correction processing by performing composition processing such as a RSOS (root sum Of square) method on a PAC image of each channel and performing division similarly to the WBC image, or the like can be performed. When dividing by a WBC image, for example, one collected by pre-scanning prior to the main scanning can be used as the WBC image.

As described above, according to the present embodiment, imaging time can be shortened. Specifically, according to the present embodiment, because the sensitivity map in the time-space is derived from imaging data of the main imaging, calibration imaging is not necessarily required and the imaging time can be shortened by that. Furthermore, because a method of deriving a sensitivity map in the time-space is available, an MR image can be generated with a sensitivity map corresponding to a time, occurrence of artifacts can be suppressed, and the image quality can be improved.

Embodiments are not limited to the embodiment described above.

In the embodiment described above, an example in which after the data deriving unit 123b interpolates missing samples, the sensitivity deriver 123c performs the Fourier transform and the linear transform on time-series data in which the missing samples have been interpolated (time-series data in which known samples and estimation samples are combined) to derive a sensitivity map has been explained. In other words, an example in which the step of interpolating a missing sample and a step of deriving a sensitivity map are performed in separate steps has been explained. However, embodiments are not limited thereto. For example, in the fast Fourier transform, the Fourier transform is broke down into multiple Fourier transform steps to be performed sequentially, and if the first step thereof is arranged to include the interpolation operation without using missing samples, calculation without the operation of interpolating missing samples can be made possible. In this case, the data deriving unit 123b, among respective components shown in FIG. 1 and FIG. 5, is included in the sensitivity deriver 123c, and the sensitivity deriver 123c can, for example, perform computation including the operation of interpolating missing samples in calculation of the Fourier transform.

Furthermore, while in the embodiment described above, a case where the MRI apparatus 100, which is a medical diagnostic imaging apparatus, performs various kinds of processing has been explained, embodiments are not limited thereto. For example, instead of the MRI apparatus 100, an image processing apparatus that is different from the MRI apparatus 100, or an image processing system that includes the MRI apparatus 100 and an image processing apparatus can perform the various kinds of processing described above. The image processing apparatus is, for example, a workstation, an image storage device (image server) or a viewer of PACS (picture archiving and communication system), various devices in an electrical medical chart system, and the like. In this case, for example, the image processing apparatus accepts the k-space data collected by the MRI apparatus 100 by receiving from the MRI apparatus 100 or from the image server through a network, or by being input by an operator through a recording medium, to store in a storage unit. The image processing apparatus can then perform various kinds of processing (for example, processing performed by the arranger 123a, the sensitivity deriver 123c, and the image generator 123d) described above on this k-space data stored in the storage unit. In this case, the image processing apparatus includes respective components corresponding to, for example, the arranger 123a, the sensitivity deriver 123c, and the image generator 123d.

(Program)

Instructions given in the processing procedure presented in the embodiment described above can be executed based on a software program. By recording this program by a general-purpose computer system in advance, and by reading this program, similar effects as the effects obtained by the MRI apparatus or the image processing apparatus of the embodiment described above can be achieved. The instructions described in the embodiment described above are recorded as a program that can be executed by a computer, in a magnetic disk (a flexible disk, a hard disk, or the like), an optical disc (a CD-ROM, a CD-R, a CD-RW, a DVD-ROM, a DVD±R, a DVD±RW, or the like), a semiconductor memory, or a recoding medium of a similar kind. As long as the recording medium can be read by a computer or an integrated system, the recording form can take any form. If a computer reads the program from this recording medium and executes the instruction described in the program based on this program by the CPU, a similar operation as that of the MRI apparatus and the image processing apparatus of the embodiment described above can be achieved. Of course, when the computer acquires or reads the program, the computer can acquire or read through a network.

Moreover, an OS (operating system) that operates on the computer, database management software, MW (middleware) of a network, etc. or the like can perform a part of each processing to achieve the embodiment described above based on instructions of the program that is installed in the computer or the integrated system from the recording medium.

Further, the recording medium is not limited to a medium independent of the computer or the integrated system, and includes a recording medium that stores or temporarily stores the program by downloading the program that is transmitted through a LAN (local area network), the Internet, and the like.

Moreover, the number of the recording medium is not limited to one, and a case where the processing in the embodiment described above is performed from more than one medium is also included in the recording medium in the embodiment, and the configuration of the medium can take any configuration.

The computer or the integrated system according to the embodiment is to perform each processing in the embodiment described above based on the program recorded in the recording medium, and can take any of configurations of a single-unit apparatus such as a personal computer and a microcomputer, a system in which multiple devices are connected through a network, and the like.

(Hardware Configuration)

Figure 19:
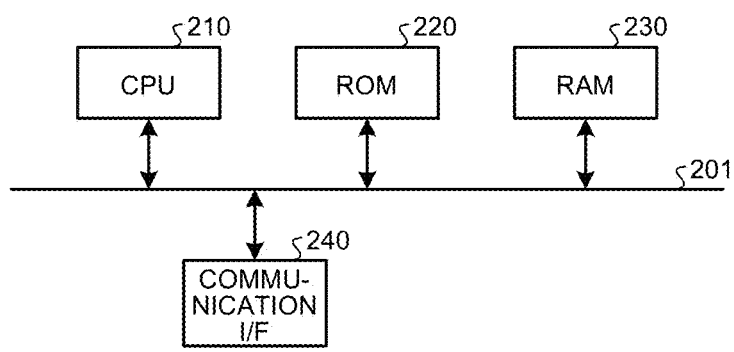
FIG. 19 is a hardware configuration diagram of an image processing apparatus according to the embodiment.

FIG. 19 is a hardware configuration diagram of the image processing apparatus according to the embodiment. The image processing apparatus according to the embodiment described above includes a controller device such as a CPU (central processing unit) 210, a storage device such as a ROM (read only memory) 220 and a RAM (random access memory) 230, a communication I/F 240 that executes communication connecting to a network, and a bus 201 that connects respective components.

The program executed by the image processing apparatus according to the embodiment described above is installed in the ROM 220 and the like to be provided. Furthermore, the program executed by the image processing apparatus according to the embodiment described above can make the computer function as the respective components (for example, the arranger 123a, the sensitivity deriver 123c, and the image generator 123d) of the image processing apparatus described above. This computer can read the program from a computer-readable recording medium onto a main storage device to execute the program with the CPU 210.

According to the magnetic resonance imaging apparatus and the image processing apparatus of at least one embodiment described above, the imaging time can be shortened.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus comprising:
    an arranger that arranges time-series data as a subset of k-space sampling points determined based on an imaging parameter;
    a sensitivity deriver that derives a time-space sensitivity distribution, in which time-series data transformed in a time direction is expressed with a coefficient value, based on presence or absence of time-direction sensitivity and transformation data obtained by transforming the time-series data in the time direction; and
    an image generator that generates an image of the time-series data using the time-series data and the sensitivity distribution.

2. The magnetic resonance imaging apparatus according to claim 1, wherein the arranger arranges the time-series data as a subset of sampling points for at least one direction in a space including a time-direction space and an image space.

3. The magnetic resonance imaging apparatus according to claim 1, wherein the sensitivity deriver derives a binarized sensitivity distribution that indicates presence or absence of time-direction sensitivity by binarizing the transformation data, and derives the sensitivity distribution by setting sensitivity of a pixel at which sensitivity is not present in the binarized sensitivity distribution to zero.

4. The magnetic resonance imaging apparatus according to claim 3, wherein the sensitivity deriver corrects the transformation data that has been quantized with an N-value, using a pattern of the time direction, and binarizes the corrected transformation data.

5. The magnetic resonance imaging apparatus according to claim 1, wherein the arranger arranges the time-series data such that sampling points of chronologically sequential frames vary in a predetermined direction in k-space.

6. A magnetic resonance imaging apparatus comprising:
    an arranger that arranges time-series data as a subset of k-space sampling points determined based on an imaging parameter;
    a sensitivity deriver that derives a time-space sensitivity distribution, in which time-series data transformed in a time direction is expressed with a coefficient value, based on the time-series data; and
    an image generator that generates an image of the time-series data using the time-series data and the sensitivity distribution, wherein the sensitivity deriver derives the time-space sensitivity distribution using time-series data that is arranged at the sampling points and time-series data that is derived as time-series data of a point at which no time-series data is arranged.

7. The magnetic resonance imaging apparatus according to claim 6, wherein the sensitivity deriver derives the time-series data at the point at which no time-series data is arranged as zero.

8. An image processing apparatus comprising:
    an arranger that arranges time-series data as a subset of k-space sampling points determined based on an imaging parameter;
    a sensitivity deriver that derives a time-space sensitivity distribution, in which time-series data transformed in a time-direction is expressed with a coefficient value, based on presence or absence of time-direction sensitivity and transformation data obtained by transforming the time-series data in the time direction; and
    an image generator that generates an image of the time-series data using the time-series data and the sensitivity distribution.

9. A magnetic resonance imaging apparatus comprising
    a processor; and
    a memory that stores processor-executable instructions that, when executed by the processor, cause the processor to:
    arrange time-series data as a subset of k-space sampling points determined based on imaging parameters,
    derive a time-space sensitivity distribution, in which time-series data transformed in a time direction is expressed with a coefficient value, based on presence or absence of time-direction sensitivity and transformation data obtained by transforming the time-series data in the time direction, and
    generate an image of the time-series data using the time-series data and the sensitivity distribution.

10. A magnetic resonance imaging apparatus comprising:
    an arranger that arranges time-series data as a subset of k-space sampling points determined based on an imaging parameter;
    a sensitivity deriver that derives a first time-space sensitivity distribution, in which the time-series data transformed in a time direction is expressed with a coefficient value, based on the time-series data; and
    an image generator that generates an image of the time-series data using the time-series data and the first sensitivity distribution,
wherein
    the sensitivity deriver derives the first sensitivity distribution based on a second sensitivity distribution and transformation data obtained by transforming the time-series data in the time direction, the second sensitivity distribution being sensitivity distribution in a space acquired for each channel.

11. The magnetic resonance imaging apparatus according to claim 10, wherein
    the sensitivity deriver derives a third sensitivity distribution based on the transformation data, and derives the first sensitivity distribution by correcting the third sensitivity distribution using the second sensitivity distribution.

12. The magnetic resonance imaging apparatus according to claim 11, wherein the sensitivity deriver performs the correction when the second sensitivity distribution does not vary in the time direction.

* * * * *